US011860535B2

(12) United States Patent
Verschuuren

(10) Patent No.: US 11,860,535 B2
(45) Date of Patent: Jan. 2, 2024

(54) IMPRINT LITHOGRAPHY STAMP METHOD OF MAKING AND USING THE SAME

(71) Applicant: KONINKLIJKE PHILIPS N.V., Eindhoven (NL)

(72) Inventor: Marcus Antonius Verschuuren, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 96 days.

(21) Appl. No.: 17/507,827

(22) Filed: Oct. 22, 2021

(65) Prior Publication Data
US 2022/0043341 A1 Feb. 10, 2022

Related U.S. Application Data

(63) Continuation of application No. 16/092,319, filed as application No. PCT/EP2017/058309 on Apr. 6, 2017, now Pat. No. 11,163,230.

(30) Foreign Application Priority Data

Apr. 6, 2016 (EP) ..................... 16164085

(51) Int. Cl.
*G03F 7/00* (2006.01)
*B29C 33/38* (2006.01)
*C08G 77/06* (2006.01)
*B29C 33/42* (2006.01)
*B81C 1/00* (2006.01)
*B29K 83/00* (2006.01)
*B29L 31/00* (2006.01)

(52) U.S. Cl.
CPC ........ *G03F 7/0002* (2013.01); *B29C 33/3842* (2013.01); *B29C 33/424* (2013.01); *B81C 1/0046* (2013.01); *C08G 77/06* (2013.01); *B29C 2033/426* (2013.01); *B29K 2083/00* (2013.01); *B29L 2031/757* (2013.01)

(58) Field of Classification Search
CPC combination set(s) only.
See application file for complete search history.

(56) References Cited

U.S. PATENT DOCUMENTS 11,163,230 B2 * 11/2021 Verschuuren ......... G03F 7/0002
2002/0050220 A1   5/2002 Schueller et al.
2003/0059537 A1   3/2003 Chilkoti et al.
2004/0026121 A1 * 2/2004 Bernds ............. H01L 21/31133
                                                           430/311
2008/0011934 A1   7/2008 Verschuuren et al.
2010/0038649 A1   2/2010 Lee
2015/0293442 A1 * 10/2015 Kreindl ................. G03F 7/0015
                                                           101/32
2019/0243237 A1 * 8/2019 Watkins ................. C09D 11/52

FOREIGN PATENT DOCUMENTS

| EP | 1193056 A1 | 4/2002 |
| EP | 1538481 A1 | 6/2005 |
| EP | 2190641 B2 | 6/2010 |
| EP | 2463073 A1 | 6/2012 |
| EP | 2602081 A1 | 6/2013 |
| JP | 2004046732 A | 2/2004 |
| JP | 2007245702 A | 9/2007 |
| JP | 2012018045 A | 1/2012 |
| WO | WO0052080 | 9/2000 |
| WO | WO2003099463 A2 | 12/2003 |
| WO | WO2008053418 A2 | 5/2008 |
| WO | WO2009141774 A1 | 11/2009 |
| WO | WO2009147602 A2 | 12/2009 |
| WO | WO2014097096 A1 | 6/2014 |
| WO | WO2014097097 A1 | 6/2014 |
| WO | WO2015078520 A2 | 6/2015 |

OTHER PUBLICATIONS

T. Kaufmann et al."Stamps, Inks, and Substrates: Polymers in Microcontact Printing" Polymer Chemistry, vol. 1, No. 4, Jan. 2010, pp. 371-387.
Vekki and Skvortsov "Metal Complex Catalyzed Hydrosilylation of Vinyl with Hydrosiloxanes", Chemistry and Chemical Technology, Technology of Organic Sustances, Bulletin of the Saint Petersburg State Institute of Technology (Technical University) (vol. 19, issue 45, pp. 97-114 ), Jan. 2013.
Varala, R. et al., "Molecular Iodine-Catalyzed Facile Procedure for N-Boc Protection of Amines", Indian Institute of Chemical Technology, Hyderabad-500 007, J. Org. Chem, 2006, 71 (21), pp. 8283-8286.

* cited by examiner

Primary Examiner — Marc S Zimmer

(57) ABSTRACT

Disclosed is a stamp (14) for an imprint lithography process, the stamp comprising an elastomer stamp body including a polysiloxane bulk portion (110) and a patterned surface comprising a feature pattern (16) for imprinting an imprinting composition (12) wherein the elastomer stamp body comprises a basic organic amine in an amount of at least 0.1% by weight based on the total weight of the elastomer stamp body. Also disclosed are methods of manufacturing such a stamp, and a method of forming a patterned layer on a substrate using such a stamp.

12 Claims, 3 Drawing Sheets

IMPRINT LITHOGRAPHY STAMP METHOD OF MAKING AND USING THE SAME

CROSS-REFERENCE TO PRIOR APPLICATION

This application is a continuation of Ser. No. 16/092,319 filed Oct. 9, 2018, which is U.S. National Phase application under 35 U.S.C. § 371 of International Application No. PCT/EP2017/058309, filed on Apr. 6, 2017, which claims the benefit of European Patent Application No. 16164085.9, filed on Apr. 6, 2016. These applications are hereby incorporated by reference herein.

FIELD OF THE INVENTION

The invention relates to a stamp for an imprint lithography process, methods of manufacturing such a stamp, and methods of imprinting using the stamp or use of such a stamp in an imprinting process.

BACKGROUND OF THE INVENTION

Imprint lithography is a technique in which a patterned layer such as a masking layer is formed on a substrate such as a semiconductor substrate or as an optical layer by the deposition of a solidifiable (also referred to as curable) imprintable composition (also referred to as medium or ink). The imprintable medium is subsequently patterned by imprinting the medium with a stamp having a relief pattern on one of its surfaces, after or during which the medium is solidified. Solidification can e.g. be achieved when the medium is exposed to light, e.g. UV-light to initiate a solidification (curing) reaction in the medium. After the reaction is completed, the stamp is removed from the cured medium to leave a patterned layer which may serve as a mask layer e.g. on the semiconductor substrate, or as a functional (optical) layer on a carrier.

This technique has recently drawn considerable attention because it can potentially provide a significant cost reduction over traditional optical lithography processes especially when large surface areas need to be provided with features of size comparable to or smaller than wavelength of visible light. In addition to imprinting planar surfaces, imprint lithography can be used for forming nanoscale patterns on so-called 2.5D surfaces, i.e. contoured surfaces, which for instance may comprise one or more protrusions, e.g. curved protrusions, emanating from a mainly planar surface. Such techniques may be used to pattern photo-voltaic solar cells, nanowires, vertical (external) cavity surface emitting lasers, medical implants and so on, e.g. by creating nanoscale patterns on optical elements, e.g. lenses or on medical implants, e.g. to stimulate bone or tissue regeneration. To this end, a planar pliable patterned stamp, such as a polysiloxane-based rubber-like stamp, is typically deformed onto the contoured surface such that the stamp pattern is brought into contact with the contoured surface to be patterned. An example of such a stamp is shown in US 2008/0011934 A1.

In at least some imprint lithography applications, imprinting compositions (also referred to as imprint media or imprint inks) are used that are based on siloxane sol-gel chemistry according to Reaction Scheme I below.

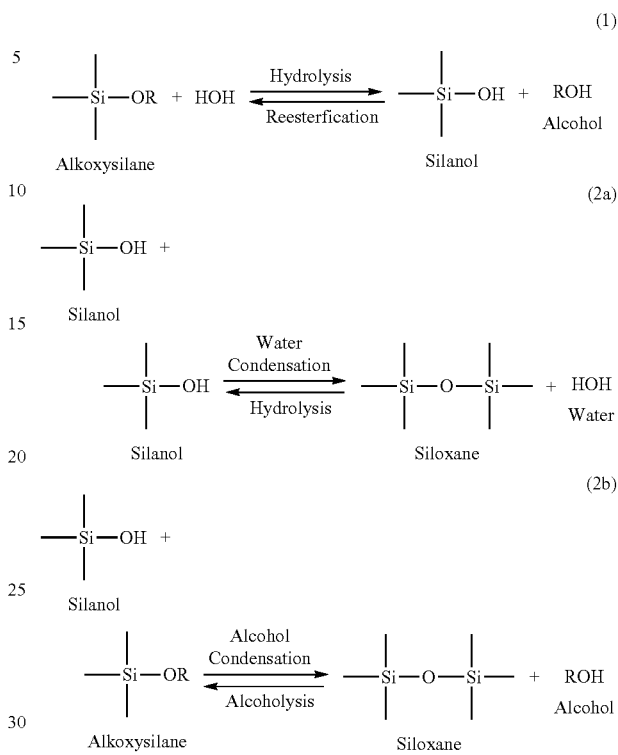

Reaction Scheme I

In the reaction to form a sol-gel system, alkoxysilanes may be used which undergo the reaction steps as shown in Reaction Scheme I in the presence of an acid or a base. Reaction scheme I shows the acid-catalyzed reaction. The alkoxysilanes undergo a hydrolysis, which is followed by a condensation reaction between two hydrolyzed alkoxysilanes (water condensation reaction) or between a hydrolyzed alkoxysilane and an unreacted alkoxysilane (alcohol condensation reaction) in which the crosslinked inorganic network is formed. The degree of crosslinking can be controlled by appropriate choice of the alkoxysilanes and/or solvents and water content.

Such sol-gel reactions typically are equilibrium reactions in which the equilibrium may be shifted towards polymerization (polycondensation) by diffusion of one or more of the reagents into a stamp such as a PDMS stamp. The sol-gel reaction causes the imprinting composition to solidify upon such shift towards polymerization and to freeze the inverse of the feature pattern on the imprinting surface of the stamp into the solidified imprinting composition.

However, premature solidification of the imprinting composition, e.g. prior to its imprinting with the elastomeric stamp, may prevent the feature pattern of the stamp to be truthfully replicated. For this reason, imprinting compositions can comprise a photo-acid generator (PAG) or a photo-base generator (PBG) that are activated once the imprinting stamp is positioned onto the imprinting composition, thereby avoiding premature initiation of the described solidification sol-gel reaction.

SUMMARY OF THE INVENTION

The use of PAGs or PBGs to activate solidification of imprinting compositions is not without problems. Firstly, such compounds are costly and consequently drive up the cost of the imprinting compositions. Given that such imprinting compositions are used in application domains in which profit margins are notoriously pressurized, there therefore exists a need to keep the cost of such imprinting compositions as low as possible. Secondly, the inventors have also recognized that the reaction products generated by the decomposition of such PAGs or PBGs diffuse into the stamp where they contaminate the stamp, e.g. react with the stamp material and cause a change in the chemistry of the stamp material. It has been found that such contamination reduces the lifetime of the stamp in the sense that after 50-100 imprinting cycles the stamp may no longer be able to impart a high-quality feature pattern onto the imprinting composition. This is also highly undesirable in production processes in which high volumes of a product needs to be produced in a single production run, i.e. without the need to replace the stamp.

It is a goal of the present invention to reduce at least one of the above mentioned drawbacks at least partially. This goal is reached with the invention which seeks to provide a stamp, methods of manufacturing such a stamp and methods of using such an stamp in an imprint process as defined by the independent claims. The dependent claims provide advantageous embodiments.

The invention thus provides a stamp for an imprint lithography process. The stamp is an elastomer stamp by virtue of its stamp body and therewith offers some degree of elasticity and flexibility that can be exploited during an imprinting process.

By providing the stamp body with an amount of at least one basic organic group capable of stimulating (assisting or causing) the solidification of the imprinting composition when the stamp is in contact with the imprinting composition, the need for an expensive photo-sensitive activator (such as a PBG) in the imprinting composition can be avoided, thereby reducing the overall cost of the imprinting composition as well as improving the lifetime of the elastomer stamp as degradation of the stamp by the photo-degradation products of such activators is also avoided. The invention thus facilitates a more durable and cost-effective imprint process.

The stamp of the invention is to be distinguished from stamps that are only modified at their relief surface with a basic organic group. Such surface modification is e.g. done with graft functionalisation or modification. The stamp of the invention rather has the base only, or also, dispersed in at least part of its interior volume or bulk portion. One disadvantage of the known surface modification is that it often is obtained by physical or chemical processes performed after relief surface preparation and that such processes may destroy the feature pattern integrity. This problem becomes more severe for smaller feature patterns. Also, the amount of base present at the surface is space limited. Hence the stamps of the invention may have an improved feature pattern integrity and improved solidification characteristics as well as more easy and reliable manufacturing.

The imprinting composition for which the stamp of the invention can be advantageously used is one that can be solidified upon exposure to a base such as provided by the basic organic group of the stamp. Thus sol-gel based imprinting compostions such as e.g. the one described in the background section, are advantageously used with the stamp of the invention. The imprinting compositions may be disposed on a substrate for example in layer form. The substrate can be flat or curved.

Stimulating the solidification of the imprinting composition can occur upon bringing the patterned surface of the stamp of the invention in contact with the imprinting composition to allow the basic organic group to stimulate the polymerization reactions in the imprinting composition for its solidification. Stimulation can be in the form of catalysis. The solidification can be due to change of the pH of the sol-gel imprinting solutions to therewith stimulate the solidification.

The invention is intended to cover basic groups that are attached such as covalently bonded to the stamp and basic groups that are only physically retained within the stamp. The latter type can be in the form of a substance that comprises one or more of the basic organic groups which is separate for the stamp body. The substances may be able to migrate through the stamp body.

Without wanting to be bound by theory, there are a number of ways the stamp can stimulate the solidification process when in contact with the imprinting composition. Thus, if there is a portion of the amount of the basic organic group located at the patterned surface of the stamp, then this fraction can directly come into contact with the imprint composition to exert its effect. This may be needed for impermeable organic polymeric bulk portions, which are impermeable to constituents of the imprinting composition such as solvents and most notably lewis acids such as protons or hydroniumions with which the basic organic group can intereact to stimulate solidification. If the organic polymeric bulk portion of the stamp is however permeable to the above imprinting composition constituents, then the basic organic groups do not need to be present at the surface as they can be reached by the migration of the constituents of the imprinting composition into the stamp. Alternatively, or additionally, if the organic polymeric bulk portion comprises the basic organic groups as part of a separate substance not chemically bound to the portion and the portion is configured to allow migration of such substance through it, then solidification can be stimulated by substances migrating towards the relief surface and even into the imprinting composition.

The organic polymeric bulk portion (or the entire stamp body) may be and preferably is a permeable or porous one. The patterned surface of the stamp preferably is in fluid communication with the organic polymeric bulk portion of the stamp. Therewith, the imprint composition, or one or more of its solvents or other constituents can enter the bulk portion e.g. to facilitate the uptake of acid (protons, hydronium ions etc) from the imprinting composition, or the displacement of the basic organic group from the stamp to the composition if the groups are not chemically bound to the stamp.

Preferably, the basic organic group is a non-charged lewis base with at least one donor atom chosen from the group consisting of oxygen, nitrogen, sulfur and phosphorous. Non-charged bases are best suited for the sol-gel based imprinting compostions as they do not get built into the solidified imprinting compositions. Most preferable are donor atoms in the form of Nitrogen as these may provide good bases with good pK values while being compatible with other stamp materials. For example, Nitrogen based Lewis acids may be compatible with stamp manufacturing methods requiring stamp material polymerisation catalysts that are vulnerable to charged species. The Pt or Rh catalysts used for polysiloxane crosslinking to obtain stamps with polysiloxane bulk portion and or surface layers are examples of that (see herein below).

The lewis acids with nitrogen donor preferably are amines. Preferably these amines bear at least one sp3 carbon atom, or at least two sp3 carbon atoms or at least three sp3 carbon atoms.

The basic organic group may have a pKa between 8 and 13. Sol-gel based compositions can be conveniently (with sufficient speed) solidified with such bases. Preferably the pKa is between 9 and 13 or even 10 and 13. Bases with pKa higher than 13 may sometimes interfere with the solidification reactions.

In an embodiment, the basic organic group includes a structure, or is a compound (such as an basic organic amine) according to Formula 8:

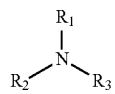

Formula 8

In Formula 8, R1-R3 may be individually selected from hydrogen, an unsubstituted or substituted C2-C20 alkyl group, an unsubstituted or substituted C2-C20 alkenyl group, an unsubstituted or substituted C2-C20 alkynyl group, an unsubstituted or substituted C3-C20 cycloalkyl group, an unsubstituted or substituted C4-C20 cycloalkenyl group, an unsubstituted or substituted C3-C20 heterocyclic group, an unsubstituted or substituted C6-C30 aryl group, an unsubstituted or substituted C6-C30 alkylaryl group, an unsubstituted or substituted C4-C30 heteroaryl group, provided that R1-R3 are not all hydrogen, wherein at least two of R1-R3 may form part of the same unsubstituted or substituted C3-C20 cycloalkyl group, unsubstituted or substituted C4-C20 cycloalkenyl group, unsubstituted or substituted C3-C20 heterocyclic group, unsubstituted or substituted C6-C30 aryl group or unsubstituted or substituted C4-C30 heteroaryl group.

In formula 8, the structure represents a non-charged lewis base with nitrogen as the donor atom of the lone pair of the lewis base.

The basic organic amine may be a secondary or tertiary amine. For example, for a secondary amine, R1 in Formula 8 may be hydrogen and R2 and R3 may be individually selected from an unsubstituted or substituted branched C3-C20 alkyl group, an unsubstituted or substituted C2-C20 alkenyl group, an unsubstituted or substituted C2-C20 alkynyl group, an unsubstituted or substituted C3-C20 cycloalkyl group, an unsubstituted or substituted C4-C20 cycloalkenyl group, an unsubstituted or substituted C3-C20 heterocyclic group, an unsubstituted or substituted C6-C30 aryl group, an unsubstituted or substituted C6-C30 alkylaryl group, an unsubstituted or substituted C4-C30 heteroaryl group, preferably wherein R2 and R3 are individually selected from an unsubstituted or substituted branched C3-C20 alkyl group or unsubstituted or substituted C6-C30 alkylaryl group.

For example, for a tertiary amine, R1-R3 in Formula 8 may be individually selected from an unsubstituted or substituted linear C2-C20 alkyl group or branched C3-C20 alkyl group, an unsubstituted or substituted C2-C20 alkenyl group, an unsubstituted or substituted C2-C20 alkynyl group, an unsubstituted or substituted C3-C20 cycloalkyl group, an unsubstituted or substituted C4-C20 cycloalkenyl group, an unsubstituted or substituted C3-C20 heterocyclic group, an unsubstituted or substituted C6-C30 aryl group, an unsubstituted or substituted C6-C30 alkylaryl group, an unsubstituted or substituted C4-C30 heteroaryl group, preferably wherein R1-R3 are individually selected from an unsubstituted or substituted linear C2-C20 alkyl group or branched C3-C20 alkyl group or an unsubstituted or substituted C6-C30 alkylaryl group.

The basic organic group preferably includes a structure according to Formula 9:

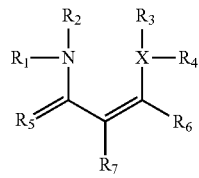

Formula 9

Herein N can be the donor atom of a lewis acid, X is chosen from the group consisting of oxygen, nitrogen, sulfur and phosphorous, and X may thus also operate as a lewis acid donor atom. $R_1$-$R_4$ are individually selected from an unsubstituted or substituted aryl group, a linear $C_2$-$C_{20}$ alkyl group or branched $C_3$-$C_{20}$ alkyl group, preferably wherein $R_1$-$R_4$ are individually selected from methyl, ethyl or propyl.

$R_5$-$R_7$ can be individual organic groups or one and the same organic group comprising one or more hydrogen, carbon, oxygen, nitrogen and sulfur atoms with less than 20 carbon atoms. Preferably there are less than 10 carbon atoms. Preferably the $R_5$ to $R_7$ form a group with a conjugated system comprising at least the two olefinic bonds of Formula 9 and one other double bond (C=N, C=O or C=C) and or at least one other carbon-carbon triple bond. Preferably, the conjugated system is an aromatic or heteroaromatic system. Preferably the heteroaromatic system comprises at least two benzene rings.

These compounds effectively have two donor atoms reinforcing their retainment of protons or other lewis acids. Hence they provide strong bases without having formal charge. They are often referred to as superbasis.

The basic organic group (as a special case of Formula 9) may have a structure according to Formula 10:

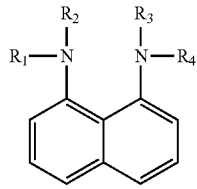

Formula 10

In Formula 10, $R_1$-$R_4$ may be individually selected from an unsubstituted or substituted linear C2-C20 alkyl group or branched C3-C20 alkyl group, preferably wherein R1-R4 are individually selected from methyl, ethyl or propyl.

The aromatic group provides a particular advantageous base with regard to strength and compatibility of polysiloxane stamp manufacture.

If the basic organic group is chemically bound to the elastomeric stamp body, and in particular the bulk organic part and/or surface layer, then in all of the basic organic groups including the ones according to Formulas 8, 9 or 10 at at least one of $R_1$ to $R_7$ may have at least one free valence with which the group is covalently attached to the stamp body, the organic polymeric bulk portion and or an organic polymeric surface layer (as will be described herein below). The binding then typically is to polymeric backbone or sidegroups of the stamp body materials. Such binding may be through carbon-carbon, ether, ester amide etc. Preferably the binding is through carbon-carbon bonds such as single carbon bonds. The example stamps where organic basic groups are bound to the polysiloxanes in the description provide examples of binding through carbon-carbon single bond. If the basic organic group is not chemically bound to the elastomer stamp in any way, but comprised within a separate substance, then the at least one free valence may be used to bind hydrogen or any other suitable or compatible chemical group.

In one group of embodiments, the basic organic group may be part of a substance not chemically bound to the elastomer stamp body. Such stamps can be made through impregnation of stamps providing access to a large number of different stamp materials to be used. Preferably, the elastomer stamp body comprises the substance in an amount of at least 0.1% by weight based on the total weight of the elastomer stamp body. This provides a good speed of solidification at least when used in conjunction with polysiloxane stamp body and silicon based sol-gel imprinting compositions.

The basic organic group preferably has a vapour pressure of 0.2 mbar or less at a temperature of 25° C. This ensures that for imprinting processes performed at room temperature (25° C.), the basic organic substance (amine) is effectively retained within the stamp, thereby extending the lifetime of the stamp as well as avoiding premature polymerization of the imprinting composition when the stamp is brought into the vicinity of the imprinting composition due to unwanted diffusion of a volatile substance from the stamp into the imprinting composition.

In another group of embodiments, wherein the stamp is not part of a separate substance, the basic organic group is covalently attached to the elastomer stamp body either within the organic polymeric bulk portion, or, if the stamp body comprises an organic polymeric surface layer (120) adhered to the organic polymeric bulk portion which surface layer includes the patterned layer, at least for part of the amount of basic organic group within the organic polymeric surface layer.

In the bound basic organic group stamps, there is at least a portion of the amount of the basic organic groups located close to the relief surface of the stamp. This may be in a single layer stamp, but also in a multiple layer stamp. Since the basic groups are now positionally fixed to the stamp, the operating mechanism of the stamp is reduced to either direct surface contact stimulation not solidification or solidification via migration of lewis acid constituents (e.g. protons or hydronium ions) from the imprinting solution to the basic organic group sites. In both cases, the location of the groups near the relief surface ensures acceptable speed of operation as migration will cost time. Advantageously, in this type of stamp, use of the stamp does not result in loss of basic function due to loss of basic organic groups as they are attached to the bulk portion. Also, such stamps can be made with improved integrity as they need no loading with base after relief layer preparation. Such loading often requires solvent assisted impregnation implying swelling of the stamp and hence possible loss of feature integrity.

The bulk portion in some embodiments may be a polysiloxane bulk portion such as a polydimethylsiloxane (PDMS) based bulk portion. PDMS is particularly suitable as a polysiloxane for use in a stamp as it offers a fluid-permeable elastomer stamp. It may also be a per-fluoro-poly-ether, or a mixture thereof. Such materials are at least compatible with the basic organic groups in the form of lewis acids with N donors such as the amines or alkylamines. Furthermore, they have good flexibility and permeability or porosity.

The organic polymeric surface layer can comprise, or consists of, a material chosen from the group consisting of at least one polysiloxane, at least one per-fluoro-poly-ether (PFPE), or a mixture thereof. Again, the polysiloxane can comprise or consist of a material chosen from the group consisting of a polydimethylsiloxane (PDMS), X-PDMS or a mixture thereof. Preferably also the bulk portion is then also a polysiloxane bulk portion.

The multiple layer stamps allow optimisation of printing properties by choice of flexibility of the surface layer different from flexibility of the rest of the bulk portion. Thus, the surface layer may preferably have a higher Young's modulus than the organic polymeric bulk portion. Preferably both the bulk portion and the surface layer having the different Young's moduli are of polysiloxanes. Preferably the surface layer has higher youngs modulus and preferably that one is made of X-PDMS (see hereinbelow). This embodiment for example is advantageous if the bulk material needs to be more flexible than the feature pattern-containing surface layer, e.g. to protect the feature pattern from distortion upon imprinting an imprinting composition layer with the feature pattern.

The surface layer preferably is a fluid permeable layer, this is especially advantageous when also the stamp itself is fluid permeable. It may even be a porous layer. Suitable materials for such a surface layer include but are not limited to PDMS and PFPE (per-fluoro-poly-ether).

The stamp may further comprise a carrier, wherein the polysiloxane bulk portion is attached to a major surface of the carrier distal to the feature pattern. Such a carrier for example may stabilise the stamp as well as facilitate the mounting of the stamp in a printing apparatus, e.g. by securing the carrier in such an apparatus. The carrier may be a rigid carrier or may be a flexible carrier having a limited degree of flexibility to support deformation of the stamp during use in an imprint process wherein application of the stamp to a substrate and/or release of the stamp from the substrate involves bending of the stamp.

The stamp according to the above described embodiments may be manufactured by a number of suitable manufacturing methods.

The invention thus provides a first method of manufacturing a stamp according to any of the previous claims, the method comprising:

providing an elastomer stamp body having an organic polymeric bulk portion and a relief surface;

impregnating the elastomeric stamp body with an amount of a substance comprising a basic organic group for stimulating solidification of the imprinting composition when in contact with the patterned surface to provide an impregnated elastomer stamp body; and removing at least part of the solvent from the impregnated elastomer stamp body to leave the elastomer stampbody comprising the basic organic substance.

According to an aspect, there is provided a method of manufacturing a stamp according to any of embodiments described in this application, wherein the method comprises impregnating the elastomer stamp body with an organic solvent having dissolved therein at least 1% by weight of the substance based on the total weight of the organic solvent to provide an impregnated elastomer stamp body; and removing the organic solvent from the impregnated elastomer stamp body.

After this impregnation and solvent removal, a dried, impregnated stamp body is obtained. Additional steps may be required to transform this into the final stamp for use in the imprinting process. Such steps may include attachment of the dried impregnated stamp body to the carrier at a distal end of the patterned surface. Alternatively, the impregnation can be performed as a last step, e.g. after attachment of a stamp body to a carrier, so that the removing of the organic solvent yields the stamp ready for use in an imprinting process.

This method has the advantage that virtually any basic organic group may be provided to a stamp of choice as long as it can be impregnated. Preferably, especially when the elastomer stamp body is made of polysiloxane, the organic solvent is a $C_1$-$C_6$ aliphatic alcohol such as methanol, ethanol, (iso-)propanol, (iso-)butanol, (cyclo)pentanol or (cyclo)hexanol as the use of such polar solvents only causes moderate swelling of the stamp body during impregnation, such that the stamp body may return to its original size upon drying. Hence feature pattern fidelity is maintained if such patterns were present before impregnation.

In this method, the substance preferably has a vapour pressure that is significantly lower than the vapour pressure of its carrier solvent, e.g. less than 20%, less than 10% or even less than 1% of the vapour pressure of its carrier solvent to ensure that the substance is retained within the stamp upon drying the stamp.

There is provided a further method of manufacturing a stamp for an imprint lithography process according to some of the embodiments described in this application.

There is thus provided a further method of manufacturing a stamp (14) according to any of claims 1 to 18, wherein the method comprises:
providing a mixture of:
one or more precursors each comprising at least one first reactive group with which it can polymerise to form the organic polymeric bulk portion, and
a substance comprising the basic organic group or comprising a protected basic organic group that does not interfere with the polymerisation;
polymerising the organic polymeric bulk portion precursor to form the organic polymeric bulk portion having enclosed therein the substance and, optionally, if the substance comprises the protected basic organic group, deprotecting the basic organic group. With this optional step the basic organic group is recovered.

In the method the one or more precursors can comprise:
a first polysiloxane precursor having as the at least one first reactive group at least two groups each including an unsaturated bond and each chosen from the group consisting of alkyne, alkene, vinyl, aldhyde, ketone and imine, and
a second polysiloxane precursor having at least two hydrosilane groups, and wherein the mixture further comprises
a hydrosilylation catalyst for catalysing an addition of an hydrosilane group across the unsaturated bond and
wherein the polymerisation includes causing the addition of the hydrosilane groups across the unsaturated bonds to therewith form the organic polymeric bulk portion.

The substance may further comprises at least one second reactive group for reacting with the first reactive group and the polymerisation may include causing a reaction between the first reactive group and the second reactive group to therewith attach the substance to the organic polymeric bulk portion.

The method can comprise dissolving the substance in one of the polysiloxane precursors, preferably substances having an unsaturated bond are then mixed with the first precursor, while substances having a group that can be added across the unsaturated bond is mixed with the second precursor.

This manufacturing method has the advantage that swelling of the stamp during its loading with the substance is avoided, but this method is suitable for only a subset of the amines that are suitable for use in the above impregnation method. This is because some basic substances can poison the platinum catalyst, thereby preventing the hydrosilylation cross-linking reaction to complete to a desirable level.

Suitable substances in the form of amine bases for this method include the secondary amines of Formula 8 in which R1 is hydrogen and R2 and R3 are individually selected from an unsubstituted or substituted branched C3-C20 alkyl group, an unsubstituted or substituted C2-C20 alkenyl group, an unsubstituted or substituted C2-C20 alkynyl group, an unsubstituted or substituted C3-C20 cycloalkyl group, an unsubstituted or substituted C4-C20 cycloalkenyl group, an unsubstituted or substituted C3-C20 heterocyclic group, an unsubstituted or substituted C6-C30 aryl group, an unsubstituted or substituted C6-C30 alkylaryl group, an unsubstituted or substituted C4-C30 heteroaryl group, preferably wherein R2 and R3 are individually selected from an unsubstituted or substituted branched C3-C20 alkyl group or unsubstituted or substituted C6-C30 alkylaryl group.

Suitable amines for the method further include the tertiary amines of Formula 8 in which R1-R3 are individually selected from an unsubstituted or substituted linear C2-C20 alkyl group or branched C3-C20 alkyl group, an unsubstituted or substituted C2-C20 alkenyl group, an unsubstituted or substituted C2-C20 alkynyl group, an unsubstituted or substituted C3-C20 cycloalkyl group, an unsubstituted or substituted C4-C20 cycloalkenyl group, an unsubstituted or substituted C3-C20 heterocyclic group, an unsubstituted or substituted C6-C30 aryl group, an unsubstituted or substituted C6-C30 alkylaryl group, an unsubstituted or substituted C4-C30 heteroaryl group, preferably wherein R1-R3 are individually selected from an unsubstituted or substituted linear C2-C20 alkyl group or branched C3-C20 alkyl group or an unsubstituted or substituted C6-C30 alkylaryl group.

Suitable amines further include a compound according to Formula 10:

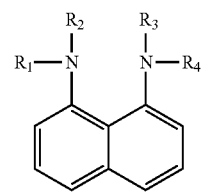

Formula 10

In Formula 10, R1-R4 may be individually selected from an unsubstituted or substituted linear C2-C20 alkyl group or branched C3-C20 alkyl group, preferably wherein R1-R4 are individually selected from methyl, ethyl or propyl.

In an embodiment, the method further comprises grafting or adhering a surface layer comprising the patterned surface to the stamp body comprising the basic organic amine, the surface layer having a higher Young's modulus than the polysiloxane-based bulk portion. This has the advantage that the surface layer may not be exposed to the basic organic amine during its curing, thereby avoiding the risk that this surface layer does not achieve its required modulus. The polysiloxane-based bulk portion may act as an adhesive between the surface layer and a stamp carrier.

In the inclusion method the base precursor may further comprise at least one second reactive group capable of reacting with the first reactive group and the polymerisation may include causing a reaction between the first reactive group and the second reactive group to therewith attach the substance to the organic polymeric bulk portion.

With this method effectively the basic organic groups can be attached to the elastomer stamp, the organic polymeric bulk portion and/or the surface layer if present. In this method preferably:

the one or more precursors comprise:
  a first polysiloxane precursor having as the at least one first reactive group at least two groups each including an unsaturated bond and each chosen from the group consisting of alkyne, alkene, vinyl, aldhyde, ketone and imine, and
  a second polysiloxane precursor having at least two hydrosilane groups, and
the at least one second reactive group is chosen from the group consisting of alkyne, alkene, vinyl, aldhyde, ketone, imine and hydrosilane; and the mixture further comprises:
a hydrosililation catalyst for catalysing an addition of an hydrosilane group across the unsaturated bond; and
wherein the polymerisation step includes causing the addition of the hydrosilane groups across the unsaturated bonds to therewith form the organic polymeric bulk portion.

The invention provides kits of parts for use with the methods of manufacture of the stamps. All features specified for the stamp constituents can be used to specify the kits of parts. The kits of parts can include manuals describing the methods of the invention. The kits of parts can include one or more agents such as for providing Boc groups for protection of amines (to have protected amines in the from of crabamates) or other bases.

The invention also provides a use of a stamp according to any one of claims 1-19 in an imprint lithography process for forming a patterned layer.

The invention also provides a method of forming a patterned layer, the method comprising:
  providing a layer of an imprinting composition (12), the imprinting composition being capable of solidification under the influence of an organic basic group;
  contacting the layer with a stamp (14) as claimed in any of claims 1-18 such that the relief feature pattern (16) is imprinted into the layer of the imprinting composition;
  retaining the contact between the layer of the imprinting composition and the stamp until the imprinted composition has reached a desired degree of solidification; and
  releasing the stamp from the solidified layer of the imprinting composition to yield the patterned layer.

Further specifications of the use or method can be the following. The patterned layer may be formed on a substrate, which may be flat or curved. Flexible stamps are extremely advantageous for curved substrate patterning as they can conform to the substrate surface. In an advantageous embodiment, the imprint process make use of a base stimulable solidifiable imprinting composition. More preferably this is a sol-gel or silicon chemistry based sol-gel imprinting composition, such as alkoxysiloxane-based sol-gel imprinting composition. Such sol-gels are by virtue of their chemistry base stimulable. Furthermore, they are often at least partly water born and hence provide easy application and release from a rubber/elastomer stamp. This is especially so when the stamp is based on polysiloxane bulk portion, and or surface layer or stamp body. The imprinting composition preferably does not comprise a photo-sensitive activator for solidification of the imprinting composition. Thus, Preferably, the alkoxysiloxane-based imprinting composition does not comprise a photo-sensitive activator of a polymerization reaction of the alkoxysiloxanes.

The reaching the degree of solidification comprise or consist of reaching a desired degree of cross-linking of the alkoxysiloxanes within the imprinting composition. Such an imprinting method benefits from the facts that: stimulated solidification of imprinting compositions is possible even with use of solidification retarded imprint resists (such resists have been disclosed in e.g. WO2014/097096 as also partly described herein below), while it is more cost-effective than imprinting methods in which an expensive photo-labile activator, e.g. a PAG or PBG, is included in the imprinting composition. A further benefit stems from the fact that the basic organic amine-loaded stamp can have a prolonged lifetime as the stamp is not degraded by the photo-degradation products of such photo-labile activators.

During one or more of the contacting and retaining steps (preferably only the retaining step), the imprinting composition may be heated to above environmental temperature (usually room temperature). Heating can take place to a temp higher than 30, higher than 40, or higher than 50, or even higher than 80 degrees centigrade. This is advantageous for faster solidification. This may be especially advantageous when using stamps wherein the base groups are not attached to the stamp body and are free to migrate. Migration can be faster at higher temp.

Preferably, the compound of formula 9 comprises one or more substituents each including at least one vinyl group. More preferably, the one or more substituents are attached to the aromatic system at one of the hydrogen carrying positions in stead of the hydrogen(s).

The surface layer 120 may be made of the same material as the polysiloxane-based body 110, e.g. may form an integral part of the polysiloxane-based body 110 or may be a separate surface layer made of a different material to the polysiloxane-based body 110.

The surface layer 120 typically will have a thickness of no more than a few mm, e.g. 1 mm or less to ensure that the stamp layer 120 has the desired pliability characteristics. In some embodiments, the surface layer 120 may have a thickness ranging from 20-50 micron. It will be understood that the suitable thickness of the surface layer 120 will depend on the material chosen for the surface layer 120. A method as claimed in claim 22, wherein at least one of the first and second polysiloxane precursors comprises branch points where ed precursor T branched or Q branched

BRIEF DESCRIPTION OF THE DRAWINGS

Embodiments of the invention are described in more detail and by way of non-limiting examples with reference to the accompanying schematics and schematic drawings wherein the same reference numerals are used throughout the Figures to indicate the same or similar parts and wherein.

DETAILED DESCRIPTION OF THE EMBODIMENTS

Figure 1:
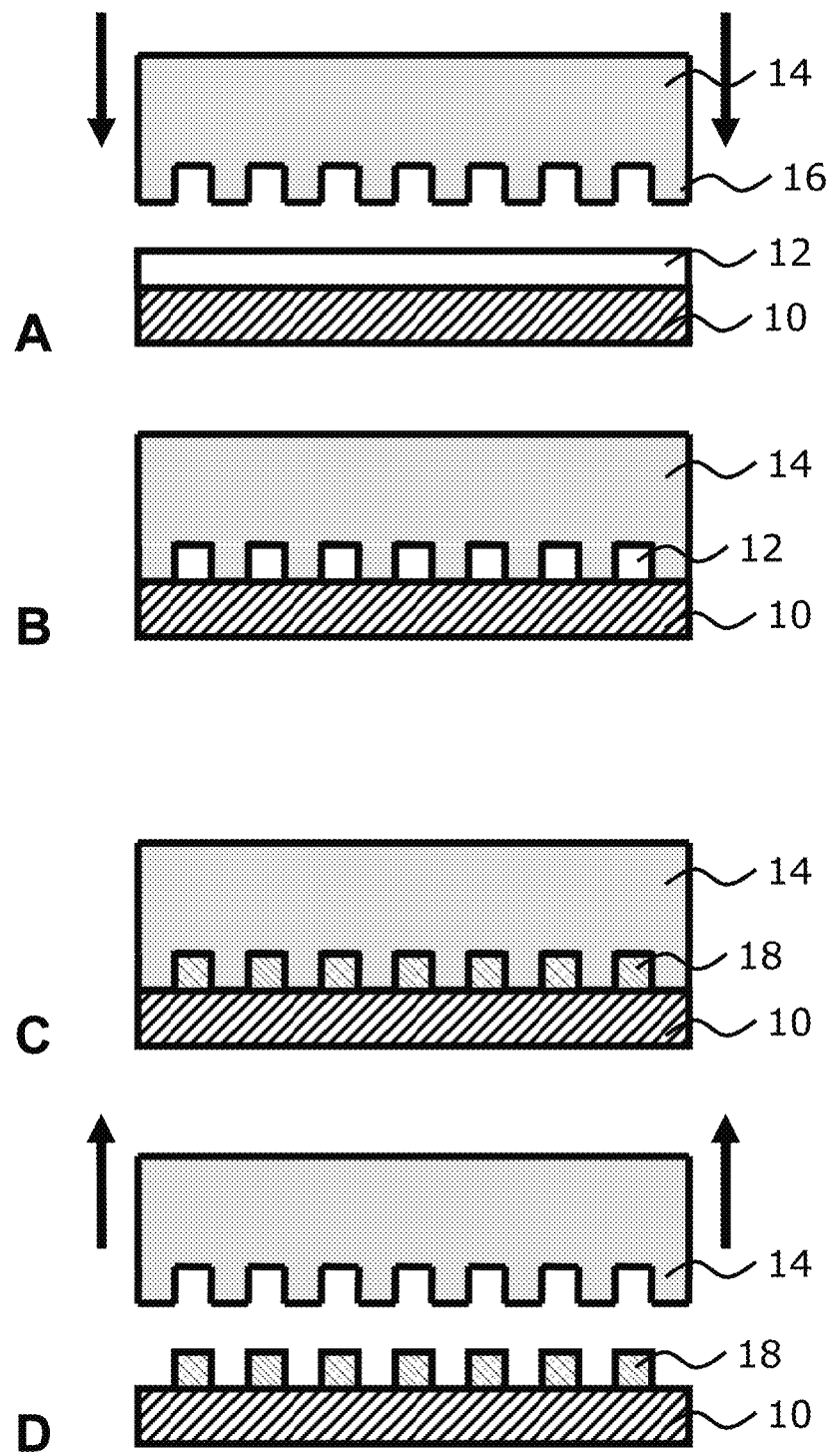
FIGS. 1 to 3 depict the various steps of imprint lithography methods.

In the context of the present application, some of the terms have the meaning below.

The term elastomer has its usual meaning within the field of chemistry. In general, an elastomer is an amorphous polymer existing above its glass transition temperature and having a viscoelasticity and weak inter-molecular forces, generally having low Young's modulus and high failure strain compared with other materials. The term, includes rubbers. Elastomers are usually thermosets (requiring vulcanization) but may also be thermoplastic. The long polymer chains are usually cross-linked (e.g. during curing, i.e., vulcanization). The elasticity is derived from the ability of the long chains to reconfigure themselves to distribute an applied stress. The covalent cross-linkages ensure that the elastomer will return to its original configuration when the stress is removed.

The inclusion of a basic organic group (amine) within the stamps interior (volume) to stimulate (catalyze or assist) solidification of imprinting solutions such as sol-gel based imprinting solutions has a number of distinct advantages. For example, the imprinting composition no longer requires the presence of a polymerization catalyst, e.g. an activator such as a PAG or PBG, which significantly reduces the cost of such compositions and improves their shelf life because accidental activation of the polymerization activator and subsequent solidification of the composition is avoided. In addition, due to the absence of such an activator, the formation of decomposition products of such an activator upon its activation is avoided. The absence of such decomposition products extends the life of the stamp as degradation of the stamp material by reaction with such decomposition products is avoided.

Where reference is made to a basic organic group, this is intended to cover groups or functionalities that are part of the stamp body via chemical bonding, or that are part of separate substances including one or more of such groups, which substances are present in the volume of the stamp body. Thus, where reference is made to a elastomer stamp loaded with a basic organic group, this is intended to cover embodiments in which the basic organic group is physically or chemically bound within the stamp body, i.e. in the volume of the stamp. This chemical bonding includes at least one of absorption or adsorption, e.g. through intermolecular forces, hydrogen bonding, ionic bonding and covalent bonding or a combination thereof. In some embodiments, the basic organic group (amine) may be reversibly bound to the stamp to facilitate reversible (partial) desorption of the basic organic amine from the stamp material to accelerate stimulation or catalysis of a polymerization reaction in an imprinting composition brought into contact with the stamp. A fluid-permeable elastomer stamp typically is permeable to gases and liquids. It may be a porous stamp (i.e. having open holes or open channels through it) but this need not be the case. Examples of (fluid-permeable) elastomer stamp materials include polydimethylsiloxanes (PDMS) and PFPE perfluoropolyether although embodiments of the present invention are not limited to these examples.

The term basic organic group is intended to include organic groups or functionalities that act as Arrhenius bases or Lewis bases. They may be conjugated bases of acids. Preferably the groups have no formal charge. The group can be a basic organic amine.

The term lewis base has the meaning as usual in chemistry. Thus by way of guidance, a Lewis base is a chemical species that reacts with a Lewis acid to form a Lewis adduct. A Lewis base, then, is any species that donates a pair of electrones (lone pair) to a Lewis acid to form a Lewis adduct. In the adduct, the Lewis acid and base share an electron pair furnished by the Lewis base. For example, OH and NW are Lewis bases, because they can donate a lone pair of electrons. While OW is an example of a lewis base having a formal negative charge, NH; is an example of un uncharge lewis base not having a formal charge. The lewis base may have its pair of electrons available for donation located on a donor atom. Many examples of donor atoms exist: Oxygen in e.g. ethers; Nitrogen in e.g. amines or alkylamines or pyridines. Sulfur in e.g. sulfides and Phosphorous in e.g. phosphines or alkyl phosphines.

The term amount is an effective amount in the sense that it means that there is enough of the basic organic group to influence the solidification upon contacting of the stamp with an imprinting composition. The amount may be specified as number of (moles) basic organic groups (each capable of binding 1 equivalent of protons) per weight of stamp body. For example the amount of groups in Mole per gram of stamp body: $>1^{-6}$, or $>0.5^{-5}$, or $>1^{-5}$, or $>0.5^{-4}$ or $>1^{-4}$ or even $>0.5^{-3}$. In general, the larger the amount, the faster the solidification can work. If stamps having basic groups therein are prepared using any of the in situ inclusion procedures as described herein below (as opposed to the impregnation procedures), then the amount may have an upper boundary because otherwise the mass fraction may become too large for a suitable rubber body to result. Suitable amounts can be $<1^{-3}$ or $<5^{-4}$ (for groups with a molar weight of 30 to 100), or $<5^{-4}$ or $<2.5^{-4}$ (for groups with a molar weight of 100 to 200), or $<3^{-4}$ or $<1.3^{-5}$ (for groups with a molar weight of 200 to 300), $<2.5^{-4}$ or $<1.2^{-4}$ (for groups with a molar weight of 300 to 400), or $<2^{-4}$ or $<1^{-4}$ (for groups with a molar weight of 400 to 500). Using the molar weight of a group can be used to calculate different amounts from weight percentages.

If the basic organic group is present as part of a separate substance, then the amount may be given weight of the substance per weight of the stamp body taking account of the number basic organic groups per substance molecule. For example, the organic polymeric bulk portion may comprise at least 0.1% by weight of substance based on the total weight of the organic polymeric bulk portion.

Thus, at least some embodiments of the present invention are concerned with providing a stamp comprising (loaded with) a basic organic group in an amount of at least 0.1% by weight based on the total weight of the elastomeric stamp for catalyzing a sol-gel reaction in an alkoxysilane-based imprinting composition used in an imprint lithography technique. In this case one preferred stamp is one wherein the organic polymeric bulk portion is a polysiloxane.

To exemplify how the stamp of the invention may work for an imprinting composition, an embodiment of an imprint lithography technique known as conformal imprint lithography based on soft (flexible) imprinting stamps, such as Substrate Conformal Imprint Lithography (SCIL), in which a flexible and fluid-permeable mold or stamp is used will be described herein below. The reader is referred to the following disclosures for more detailed information on apparatus (WO2003/099463), methods and resists (WO2008/053418 and WO2014/097096). The main advantage of conformal imprint lithography is that fine structures can be replicated on irregular (e.g. non-flat) and curved surfaces, due to the fact that the flexibility in the stamp allows for a complete contact between the stamp pattern and the surface.

FIG. 1 schematically depicts an example embodiment of an imprint lithography process according to the present invention. In step A, a major surface of a substrate 10, which may be any suitable carrier such as a silicon substrate, a silicon on insulator substrate, a GaAs substrate, a GaN substrate, an AlGaN substrate, a metal substrate such as an Al or Cr substrate, a polymer substrate such as a PMMA substrate, a glass substrate, a ceramic substrate such as sapphire and so on, is covered with a layer of a curable imprintable composition 12. This covering can be done with for example spin coating, but other techniques can be used according to need.

The chemistry of the imprinting composition 12 is not particularly limited. For example, any suitable sol-gel imprinting composition may be used for this purpose. Particularly suitable are alkoxysilane-based sol-gel imprinting compositions as such imprinting compositions are known to provide solidified patterned layers having particularly desirable properties as well as exhibit desired properties for facile deposition of the imprinting composition on a substrate 10, e.g. using spin-coating, doctor blading, ink jetting and so on, and in which the polycondensation of the silane compounds in the imprinting composition 12 can be activated on demand to ensure that the process window for imprinting the imprinting composition with an imprinting stamp is not reduced by premature polycondensation of the silane compounds in the imprinting composition. Such compositions have been described in e.g. WO2008/053418 or WO2014/097096.

In an embodiment, the imprinting composition may be based on silane monomers of Formula 1, Formula 2 or a combination thereof:

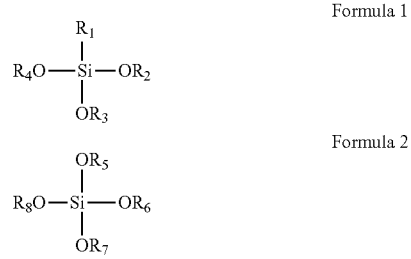

Formula 1

Formula 2 wherein $R_1$-R8 are individually selected from the group consisting of C1-C6 linear or branched alkyl groups and a phenyl group. Particularly suitable examples of such silane compounds are defined by the compounds of Formula 4-7:

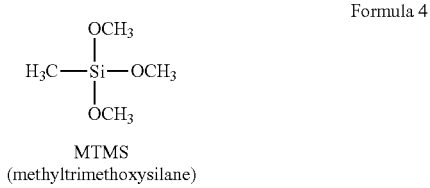

Formula 4

MTMS
(methyltrimethoxysilane)

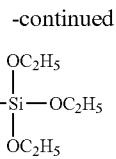

Formula 5

MTES
(methyltriethoxysilane)

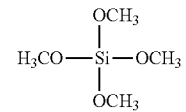

Formula 6

TMOS
(tetramethoxysilane)

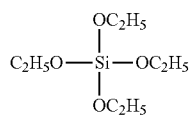

Formula 7

TEOS
(tetraethoxysilane)

The imprinting composition may be based on a first silane compound of Formula 1 and a second silane compound of Formula 2. This has the advantage that the amount of crosslinking can be controlled by varying the ratio between the first and second curable compound. Typically, an increase in the ratio towards the first curable compound reduces the crosslinking density in the network formed in the polycondensation reaction. In order to obtain the most desirable cross-linking density, the molar ratio of the first silane compound and the second silane compound is in the range of 5:1-1:5.

In a particularly suitable embodiment, the first silane compound is MTMS. It has been found that when combining MTMS with a fully inorganic silane compound, i.e. a silane compound according to Formula 2, unwanted shrinkage of the ink composition upon solidification can be largely avoided. Particularly suitable embodiments of the second silane compounds to be used in combination with MTMS are TMOS and TEOS.

In order to achieve the desired degree of polymerization in the imprinting composition prior to its deposition, i.e. to tune the viscosity of the imprinting composition to facilitate its deposition on a substrate 10, the pH of the ink composition may be set in a range of 3-5, preferably 3.5-4.5. Particularly preferable is a pH of about 4. The pH may be set using any suitable protic acid, e.g. an organic acid such as acetic acid or formic acid, or an inorganic acid such as hydrochloric acid.

It is noted that the presence of such an acid typically does not interfere with the base-loaded elastomer stamps of the present invention because most of the acid content typically evaporates from the imprinting composition upon drying, which takes place following to layer formation and prior to application of the stamp. Also, it is not necessary to bring the pH of the ink composition up to the pH of the organic base in the stamp. As long as the pH of the ink composition is raised to alkaline pH (i.e. a pH >7), rapid polycondensation of the alkoxysilane content of the imprinting can be achieved.

The ink composition may further comprise a polycondensation inhibitor according to Formula 3 that competes with the silane compounds in the polycondensation reaction as shown in Reaction Schedule I:

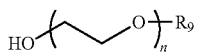

Formula 3 wherein $R_9$ is selected from the group consisting of $C_1$-$C_6$ linear or branched alkyl groups and a phenyl group, and wherein n is a positive integer having a value of at least 2. In a particular advantageous embodiment, n is 2, 3, 4 or 5.

Particularly advantageous examples of the polyethylene glycol monoether of Formula 3 include diethylene glycol monomethyl ether (EEOL), diethylene glycol monoethyl ether, triethylene glycol monomethyl ether, triethylene glycol monoethyl ether, tetraethylene glycol monomethyl ether and tetraethylene glycol monoethyl ether.

At a pH of 3-5, preferably a pH of 3-5-4.5 and more preferably a pH of around 4, it has been found that a compound of Formula 3 reduces the level of completion of the polycondensation reaction between the silane compounds in the ink or composition, i.e. shifts the equilibrium of the polycondensation reaction more towards the oligomer/monomer side of the equilibrium. In particular, silane oligomers are formed that include the compound of Formula 3. Such polycondensation retarders can for example be used to increase the shelf life and tune the viscosity of the imprinting composition, such that the imprinting composition can be more effectively applied on the substrate surface to be imprinted. It has been found that the basic organic amine-loaded stamps according to embodiments of the present invention are capable of rapidly shifting the equilibrium reaction in such imprinting compositions towards polycondensation in the presence of such inhibitors.

In an embodiment, the ink or composition may further comprise one or more additives that do not take part in the polycondensation reaction but may be used to improve the characteristics of the ink or composition. For instance, the ink or composition may contain additives that improve the film forming properties of the ink. A non-limiting example of such an additive is 1-ethoxy-2-(2-ethoxyethoxy)ethane (EEE):

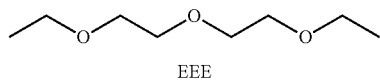

EEE

Such an imprinting composition may, by way of non-limiting example, have a composition selected from the ranges as specified in Table I. In Table I, where reference is made to weight percentages (wt %), this is relative to the total weight of the imprinting composition unless otherwise specified.

TABLE I

| Compound | Concentration Range |
| --- | --- |
| Silane monomer(s) of Formula 1 and/or Formula 2 based on the weight of the silanes when fully condensated | 1-20 wt % |
| Water | 5-20 mole per mole of silicon (or 2-40 wt %) |

TABLE I-continued

| Compound | Concentration Range |
| --- | --- |
| Solvent system (may contain multiple solvents) | 25-98 wt % |
| Polymerization inhibitor of Formula 3 | 0-10 wt % |
| Protic acid | 0.001-0.1 wt % (depending on the pKa of the acid - the amount of acid should set the pH of the composition to around 3-5, e.g. 4) |
| Film forming agent (e.g. EEE) | 0-10 wt % |

Other suitable compositions will be apparent to the skilled person as those that can be solidified with change of pH or with change of another constituent (such as e.g. metal or other ions that participate in a solidification reaction) by the stamps basic organic group Advantageously, the imprinting composition 12 does not require the presence of a polycondensation activator such as a PAG or PBG. This is because a stamp 14 is used that is loaded with an organic base capable of catalyzing the sol-gel condensation reaction of the alkoxysilanes-based imprinting, as will be explained in more detail below. Consequently, the imprinting composition is largely immune to premature polycondensation reactions that increase the viscosity of the imprinting composition and consequently reduce the ability of the stamp 14 to imprint the imprinting composition with the desired pattern. The flexible stamp 14 carries a relief feature pattern formed by spatially separated protrusions 16 is imprinted into the curable imprintable medium 12, thereby transferring the inverse pattern into this layer, as shown in step B. Although not explicitly shown, the imprinting of the deposited curable imprintable medium 12 with the flexible stamp 14 may be preceded by a drying step in which some of the solvent system is evaporated in order to increase the viscosity of the deposited curable imprintable medium 12 if desired.

Next, as depicted in step C, the imprinting stack (substrate+imprinting+flexible fluid-permeable elastomer stamp) is kept in contact such that the organic (amine) base in the flexible fluid-permeable elastomer stamp 14 can catalyze the polycondensation reaction and cause solidification (sol-forming) of the imprinting composition. Optionally, the imprinting stack may be heated to further accelerate the polycondensation reaction. Upon completion of this polymerization reaction, the stamp 14 is removed in step D, leaving behind the pattern portions 18 on the substrate 10.

Figure 2:
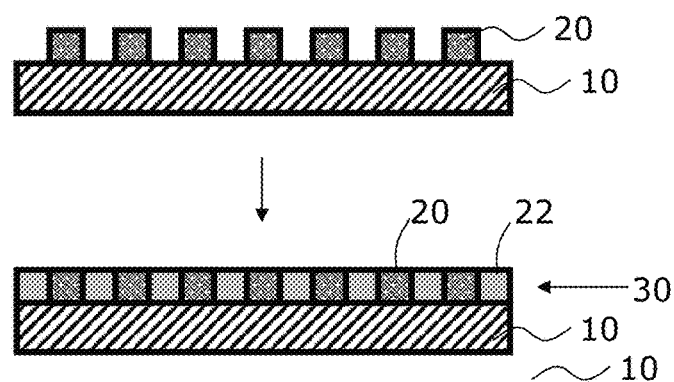

Due to the fact that such curable imprinting compositions can be used to achieve a cured patterned layer with a high inorganic content and high crosslinking density, the curable imprinting compositions may also be used for the formation of multi-layer structures, such as three-dimensional structures that have tuned optical properties, e.g. light emitting diodes, interferometers, photonic crystals and so on. Such three-dimensional structures may be produced by filling or planarizing the patterned layer 20 by depositing a planarization material 22 over the patterned layer 20, as shown in FIG. 2, and removing excess material if necessary, e.g. by etching or polishing. The planarization material 22 may be any thermally degradable material such as a thermally degradable polymer (TDP). A non-limiting example of a TDP is polynorbornene or polystyrene. Alternatively, the planarization material 22 may be soluble in a particular solvent. In general, any planarization material 22 that can be selectively removed from a formed multi-layer structure without damaging the patterned layers formed from the curable imprintable composition may be used.

Figure 3:
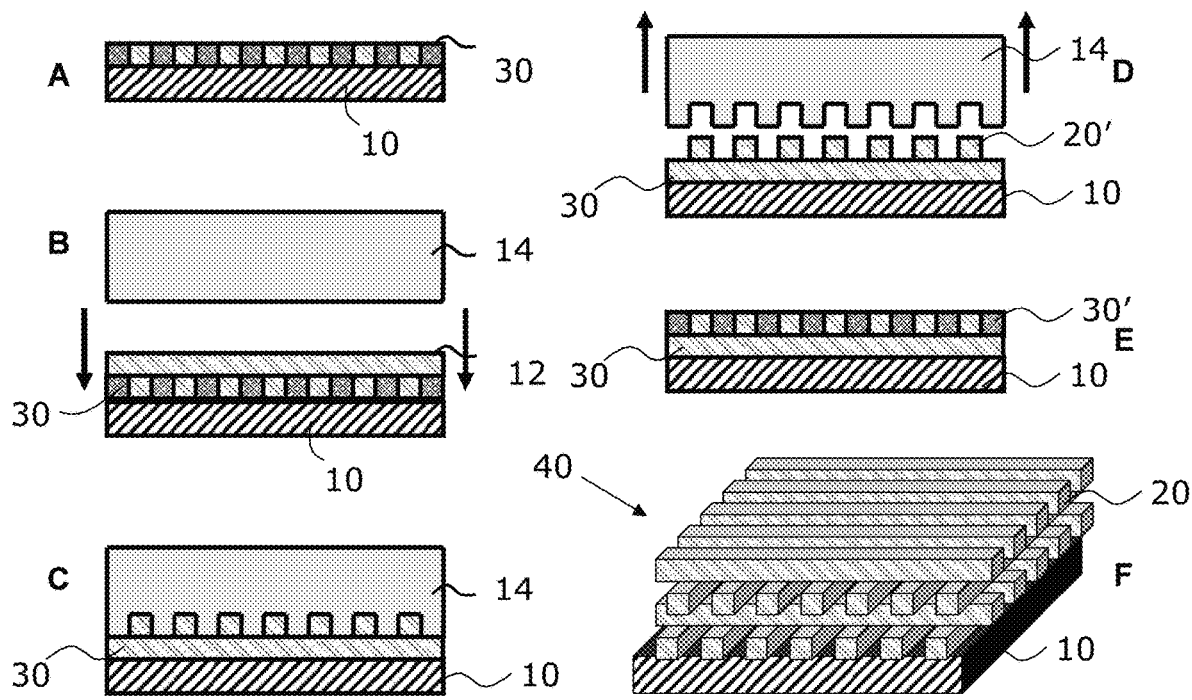

A non-limiting example of a method of manufacturing such a three-dimensional structure is shown in FIG. 3. In step A, a planarized layer 30 is formed on a substrate or carrier 10, as previously explained. The patterned portions 20 of the planarized layer 30 may be produced by imprint lithography (e.g. Substrate Conformal Imprint Lithography, SCIL) using the curable imprinting composition 12 in accordance with the method shown in FIG. 1. The pattern 20 is filled, i.e. planarized with a filling material 22. In step B, a next layer of the curable imprinting composition 12 is applied over the planarized layer 30 of step A in any suitable manner, e.g. by spincoating, dispensing or doctor blading.

The curable imprinting composition 12 deposited in step B is subsequently embossed by a suitably patterned fluid-permeable elastomer stamp 14 after alignment of the stamp with respect to the substrate 10, as shown in step C. In step C, the imprint orientation of the stamp 14 with the substrate 10 has been rotated 90° with respect to the imprint orientation used to form the first patterned layer 20. It will be appreciated that other orientation rotation angles are equally feasible. The curable imprinting composition 12 is subsequently solidified (densified), e.g. as shown in FIG. 1 to form solidified portions 20' as shown in step D. Obviously, the formation of the solidified portions 20' may be completed after removal of the stamp 14, i.e. by completing the inorganic polymerization reaction as previously discussed. Removing the stamp 14 leaves the densified portions 20' on the planarized layer 30 of step A. The newly formed patterned layer may again be planarized as shown in step E, after which additional layers may be formed by repeating the steps B-E. The height of the patterned portions of the patterned layer may be reduced using an additional processing step, e.g. by means of reactive ion etching.

The filling material 22 can be removed afterwards by e.g. dissolving the filling material 22 in a suitable solvent or by thermal decomposition, thus yielding a stacked structure as shown in step F. Alkoxysilane-based sol-gel systems are particularly mentioned for their suitability as imprintings for application in this method because in their sol state, they can withstand most solvents required to dissolve the planarization material 22, as well as withstand high temperatures up to 600 or even 1000° C., thereby making it particularly suitable for use with thermally degradable compounds such as a TDP.

It may be necessary to remove residual imprint structures from e.g. the substrate 10, for instance when a layer on the substrate 10 has been patterned using the imprint structures as a mask. The imprint structures may be removed by any suitable etching technique, e.g. reactive ion etching.

Figure 4:
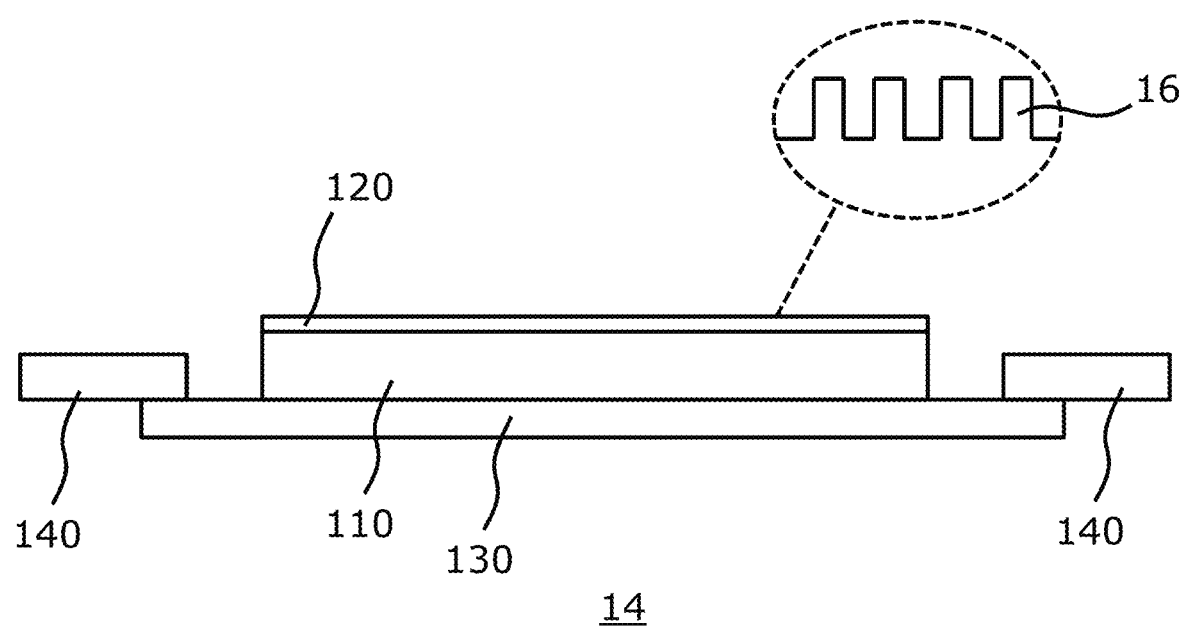
FIG. 4 depicts a patterned stamp for use in an imprint lithography method.

FIG. 4 schematically depicts an example embodiment of (e.g. fluid-permeable elastomer) stamp 14 in more detail. The stamp 14 typically comprises a body 110 which preferably is made of a polysiloxane-based material. The below description is with respect of a stamp with polyslioxane bulk portions, but other elastomer or rubber materials can be used for bulk portions. Those skilled in the art will be able to apply such other materials and employ the invention without problems. In the below examples the description will beheld with regard to the polysiloxane bulk portions. An example of such a polysiloxane-based material is PDMS (polydimethylsiloxane) although it should be understood that similar polysiloxane-based materials, e.g. a polysiloxane in which at least some of the methyl groups are replaced with larger alkyl groups, e.g. ethyl, propyl, isopropyl, butyl groups and so on, may also be contemplated. Alternatively, the polysiloxane-based material may include a T-branched and/or a Q-branched polysiloxane-based rubber-like material as for instance disclosed in WO2009/147602 A2. It is noted for the avoidance of doubt that a T-branched polysiloxane comprises 3-way branching chains, i.e. networks, for instance when crosslinked by linear polysiloxanes. Likewise, a Q-branched polysiloxane comprises 4-way branching chains, i.e. networks, for instance when crosslinked by linear polysiloxanes. Such branched materials can be used to make stamp body parts that have a higher youngs modulus as will be indicated herein below.

The stamp 14 further comprises a (e.g. fluid-permeable) surface layer 120 carrying the pattern 16 as shown in the blown up inset in FIG. 4. This layer is not needed however for the implementation of the invention. The surface layer 120 may be made of the same material as the polysiloxane-based body 110, e.g. may form an integral part of the polysiloxane-based body 110 or may be a separate surface layer made of a different material than that of the polysiloxane-based body 110. In embodiments in which the surface layer 120 is made of such a different material, the surface layer 120 may be grafted onto the polysiloxane-based body 110 or adhered to the polysiloxane-based body 110. In an embodiment, the polysiloxane-based body 110 may be adhered to the surface layer 120, e.g. prior to curing, such that the body 110 may act as an adhesive or glue between the surface layer 120 and the carrier 130. A different surface layer 120 for example may be contemplated in embodiments in which a more rigid surface layer 120 compared to the polysiloxane-based body 110 is desired, e.g. to prevent distortion or collapse of the features of the feature pattern 16. Such distortion of collapse for instance can occur in soft surface layers 120 if the feature sizes of the feature pattern 16 are particularly small, e.g. smaller than 0.5-1 micron.

In an embodiment, the surface layer 120 may have a higher Young's modulus than the polysiloxane-based body 110. The dimensions of the features 16 can e.g. be in the range of 200 nm-2 micron, a rubbery material having a Young's modulus in the range of 7-11 MPa, such as a hard PDMS may be contemplated, whereas for a stamp having dimensions of the features 16 in the range of 1 nm-200 nm, a rubbery material having a Young's modulus in the range of 40-80 MPa, such as an extra hard PDMS (sometimes referred to as X-PDMS) may be contemplated. Another example of a suitable material for the surface layer 120 is PFPE (per-fluoro-poly-ether). Other suitable polymer materials for the surface layer 120 having the desired Young's modulus will be immediately apparent to the skilled person. For the avoidance of doubt, it is noted that the reported Young's moduli have been determined by a standardized hardness test according to the ASTM D1415-06(2012) standard by penetrating the rubber material with a rigid ball under the conditions mandated by the standard.

The surface layer 120 typically will have a thickness of no more than a few mm, e.g. 1 mm or less to ensure that the stamp layer 120 has the desired pliability characteristics. In some embodiments, the surface layer 120 may have a thickness ranging from 20-50 micron. It will be understood that the suitable thickness of the surface layer 120 will depend on the material chosen for the surface layer 120.

The polysiloxane-based body 110 may be thicker than the surface layer 120 to give the stamp 14 its flexibility, in particular when the polysiloxane-based body 110 has a lower Young's modulus than the surface layer 120. For example, the polysiloxane-based body 110 may have a thickness ranging from 0.1-5 mm, such as 0.5-2 mm.

The features of the feature pattern 16 may have a feature size ranging from several microns to a few nanometers, i.e. the features 122 may define a nanopattern, although it is also feasible to use larger feature sizes. The surface layer 120 may have a Young's modulus that is tailored to the intended sizes of the features 122 of the stamp to be manufactured. For instance, for relatively large feature sizes, e.g. feature sizes of 500 nm up to several microns, e.g. 2 micron or 5 micron, a relatively soft rubbery material may be used, e.g. a rubbery material having a Young's modulus in the range of 2.5-5 MPa, such as a soft PDMS. This is because the relatively large sized features are relatively insensitive to collapse due to surface tension during the stamp manufacturing process or an imprinting process. Such collapse is typically related to the inter-feature distance, with small inter-feature distances causing overly flexible features to stick together under the influence of surface energy. It is noted that the inter-feature distance is typically but not necessarily correlated to the feature size. Hence, when smaller sizes of the features (and/or smaller inter-feature distances) are required, more rigid rubbery materials may be contemplated to prevent collapse of the smaller size features due to the aforementioned surface tension.

The feature pattern 16 may be formed in the surface layer 120 in any suitable manner. Known techniques such as electron beam patterning (and reactive ion etching) etching or interference lithography (and subsequent etching) may be used to form the feature pattern 16.

The stamp 14 may be mounted, e.g. adhered to a carrier or support 130 to improve the stability of the stamp 14. Preferably this carrier or support 130 is rigid or has a limited degree of flexibility. Thus, this support is at least more rigid than the stamp or stamp body so that it can support the stamp. The support 130 preferably is fluid-impermeable such that the substance cannot diffuse out of the stamp 14 through the support 130. The support 130 for example may be made of glass, a suitable (co-)polymer such as polymethylmethoacrylate (PMMA), polyethylenetereftalate (PET), other plastic, a metal or metal alloy, and so on. The support 130 may comprise one or more rubber seals 140 in the edge regions of the rigid support 130 to prevent spillage of the imprinting composition 12 when the substrate 10 is brought into contact with the stamp 14, which may force some of the imprinting composition 12 from the substrate 10 due to the feature pattern 16 being pressed into the imprinting composition 12.

The elastomer stamp 14 may be loaded with the basic organic group in any suitable manner.

A first example method is by impregnation. In this method, the stamp 14 may be soaked in a solution of a substance comprising the basic organic group (such as a basic organic amine) in an organic solvent for a period of time, such as a period ranging from 30 minutes to 12 hours, preferably a period ranging from 1 hour to 6 hours. The substance preferably is present in the organic solvent in an amount of at least 1% by weight based on the total weight of the organic solvent. For example, the basic organic amine may be present in an amount ranging from 1-5% by weight based on the total weight of the organic solvent. The amount of the substance in the organic solvent preferably is such that upon loading the substance in the stamp 14, the amount of the substance in the stamp 14 after removal of the organic solvent is at least 0.1% by weight based on the total weight of the stamp 14 (i.e. the total weight of the bulk material 110 and the surface layer 120). If the amount of substance in the stamp 14 is below 0.1% by weight based on the total weight of the stamp 14, polymerization of the imprinting composition as catalysed by the basic organic groups may be too slow. Although there is no particular requirement for an upper limit to the total amount of substance in the stamp 14, it has been found that amounts of the substance in excess of about 3% by weight based on the total weight of the stamp 14 no longer affect the polymerization rate of the imprinting composition 12, such that in some embodiments the amount of substance in the stamp 14 may be in the range of 0.1-3% by weight based on the total weight of the stamp 14.

Many organic solvents may be used to dissolve the substance and subsequently soak the stamp 14. Polar solvents are particularly preferred. Of such polar solvents, alcohols such as methanol, ethanol, propanol, iso-propanol, butanol, pentanol, n-hexanol and cyclohexanol are preferred because they cause modest swelling (of e.g. a polysiloxane bulk portion) only of the stamp 14. Such swelling should be avoided as much as possible because it can distort the feature pattern 16, whereas excessive swelling may not be fully reversible upon drying the stamp 14, thus leading to a distorted stamp 14 that may not be suitable for use in the above described imprinting methods.

Following the soaking step, the soaked stamp 14 may be rinsed with water to remove residual solvent from the stamp. This rinsing may be repeated any suitable number of times. Following the optional rinsing step, the soaked stamp 14 is dried to remove the organic solvent from the stamp, thereby leaving the substance loaded into the stamp 14. Such drying may be performed at elevated temperatures, e.g. in an oven or the like to reduce the drying time of the elastomer stamp 14. However, in an embodiment, the stamp 14 is dried by leaving it exposed to an ambient atmosphere or under reduced pressure at room temperature (25° C.) for at least 12 hours, e.g. 16 hours, 24 hours or even 48 hours, to allow for the evaporation of the residual organic solvent from the stamp 14.

Embodiments of this impregnation method may be used to impregnate the entirety of the stamp 14 with the substance. In alternative embodiments, only the (polysiloxane) bulk portion 110 of the stamp 14 is impregnated in this manner, with the separate surface layer 120 being grafted or adhered to the (polysiloxane) bulk portion 110 after impregnation. The surface layer 120 may be manufactured prior to the manufacturing of the polysiloxane bulk portion 110, which may be used as an adhesive between the surface layer 120 and the carrier 130. In this embodiment, the substance may diffuse into the surface layer 120 through the polysiloxane bulk portion 110 and the surface layer 120.

At least with the impregnation methods described herein it is particularly advantageous if the bulk portion 110 and/or the surface layer 120 or even the entire stamp are fluid-permeable. Impregnation can then occur faster.

It has been found that a wide variety of substances having basic organic groups (and especially lews bases with Nitrogen donors) may be used to impregnate the elastomer stamp 14 using the above impregnation method and subsequently catalyse the polymerization of the imprinting composition 12 in a lithographic imprinting process such as the process described with the aid of FIG. 1-3.

The example substances 1-36, listed in Table 2 have been successfully loaded into a PDMS stamp by impregnation. The PDMS stamp loaded with the substances 1-18 and 20 to 39 have been successfully used to solidify an alkoxysiloxane-based imprinting composition at room temperature at a faster rate compared to the rate achieved with a same stamp without a corresponding substance loaded. It is noted that compound 19 is not a base and this one die did not result in acceleration of imprinting composition. This base is included in the table for another purpose as explained hereinbelow. All compounds cause solidification of 55 nm to 150 nm thick imprinting solutions on silicon substrate within 1-5 minutes at room temperature (RT) after contacting of the stamp with the imprinting solutions. For comparison, similar thickness imprinting solutions on silicon cured with a stamp without base at around 40 min at RT and 10 minutes at 50 degrees celsius.

TABLE 2

| # | Compound |
|---|---|
| 1. | 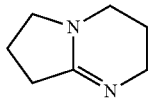 |
| 2. | 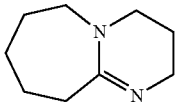 [SMILES: C1CCC2=NCCCN2CC1] |
| 3. | 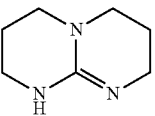 |
| 4. | 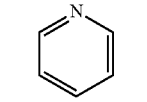 |
| 5. | 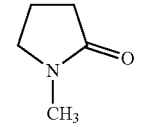 |
| 6. | 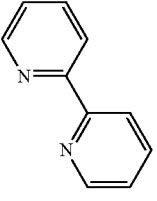 [SMILES: c1ccc(-c2ccccn2)nc1] |
| 7. | 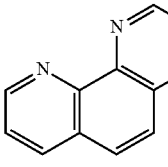 |
| 8. | 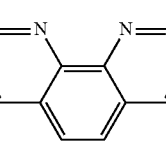 |
| 9. | 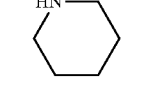 |
| 10. | $HN(n\text{-}C_2H_5)_2$ |
| 11. | $HN(n\text{-}C_2H_5OH)_2$ |
| 12. | $HN(n\text{-}C_5H_{11})_2$ |
| 13. | $H_2N(n\text{-}C_5H_{11})$ |
| 14. | $N(n\text{-}C_2H_5)_3$ |
| 15. | $N(n\text{-}C_2H_5OH)_3$ |

TABLE 2-continued

| # | Compound |
|---|---|
| 16. | 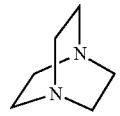 |
| 17. | $N(n\text{-}C_8H_{17})_3$ |
| 18. | $N(n\text{-}C_{12}H_{23})_3$ |
| 19. | 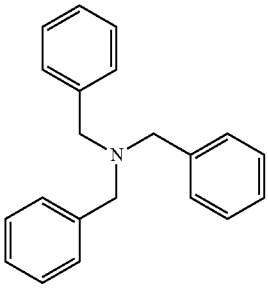 [SMILES: c1ccc(CN(Cc2ccccc2)Cc2ccccc2)cc1] |
| 20. | 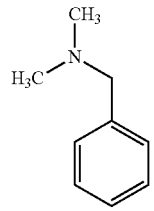 |
| 21. | 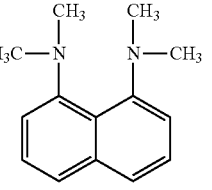 |
| 22. | 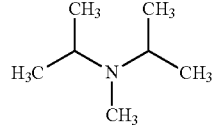 |
| 23. | 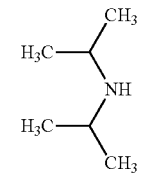 |
| 24. | 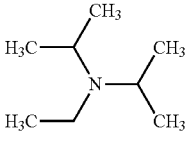 |
| 25. | 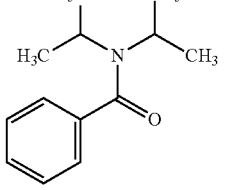 |

TABLE 2-continued

26. 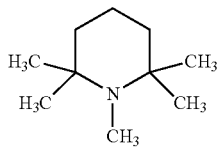

27. 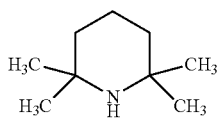

28. 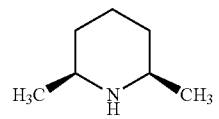

29. 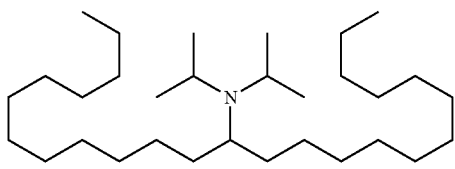 [SMILES: CCCCCCCCCCCCC(CCCCCCCCCCCC)N(C(C)C)C(C)C]

30. 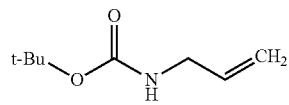

31. 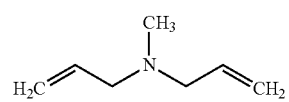

32. 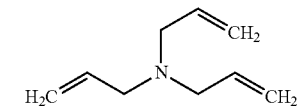

33. 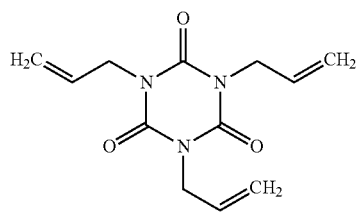 [SMILES: C=CCn1c(=O)n(CC=C)c(=O)n(CC=C)c1=O]

34. 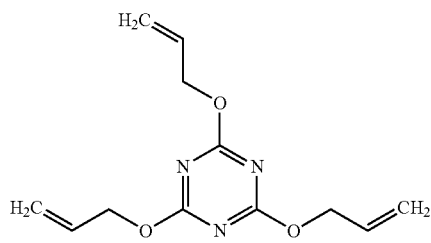 [SMILES: C=CCOc1nc(OCC=C)nc(OCC=C)n1]

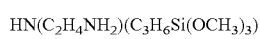

35. HN(C$_2$H$_4$NH$_2$)(C$_3$H$_6$Si(OCH$_3$)$_3$)

36. 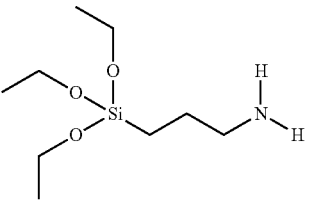

This clearly demonstrates that the substances may be selected from a wide variety of bases having a pKa of higher than 7. In general it was observed that the stronger the base (higher pKa or lower pKb) the faster the solidification of the alkoxysiloxane-based imprinting composition occurred. Preferably the base has a pKa between 8 and 13. More preferably the pKa is between 10 and 13. Based on their pKA values as known in the art, the person skilled in the art will be able to choose appropriate bases for the invention.

The wide variety of suitable substances includes, but is not limited to compounds having a Formula 8:

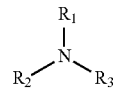

Formula 8

In Formula 8, $R_1$-$R_3$ may be individually selected from hydrogen, an unsubstituted or substituted $C_2$-$C_{20}$ alkyl group, an unsubstituted or substituted $C_2$-$C_{20}$ alkenyl group, an unsubstituted or substituted $C_2$-$C_{20}$ alkynyl group, an unsubstituted or substituted $C_3$-$C_{20}$ cycloalkyl group, an unsubstituted or substituted $C_4$-$C_{20}$ cycloalkenyl group, an unsubstituted or substituted $C_3$-$C_{20}$ heterocyclic group, an unsubstituted or substituted $C_6$-$C_{30}$ aryl group, an unsubstituted or substituted $C_6$-$C_{30}$ alkylaryl group, an unsubstituted or substituted $C_4$-$C_{30}$ heteroaryl group, provided that $R_1$-$R_3$ are not all hydrogen.

At least two of $R_1$-$R3$ may form part of the same unsubstituted or substituted $C_3$-$C_{20}$ cycloalkyl group, unsubstituted or substituted $C_4$-$C_{20}$ cycloalkenyl group, unsubstituted or substituted $C_3$-$C_{20}$ heterocyclic group, unsubstituted or substituted $C_6$-$C_{30}$ aryl group or unsubstituted or substituted C4-C30 heteroaryl group, i.e. may form part of the same ring structure.

The term "substituted" may refer to a hydrogen of a compound or group being substituted with a substituent selected from a halogen (F, Br, Cl, or I), a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a $C_1$ to $C_{20}$ alkyl group, a $C_1$ to $C_{20}$ alkoxy group, a $C_2$ to $C_{20}$ alkenyl group, a $C_2$ to $C_{20}$ alkynyl group, a $C_6$ to $C_{30}$ aryl group, a $C_7$ to $C_{30}$ arylalkyl group, a $C_1$ to $C_{20}$ heteroalkyl group, a $C_1$ to $C_{20}$ heteroaryl group, a $C_3$ to $C_{20}$ heteroarylalkyl group, a $C_3$ to $C_{30}$ cycloalkyl group, a $C_3$ to $C_{15}$ cycloalkenyl group, a $C_6$ to $C_{15}$ cycloalkynyl group, a $C_2$ to $C_{20}$ heterocycloalkyl group, and a combination thereof.

In an embodiment, only one of $R_1$-$R_3$ is hydrogen, i.e. the substance is a secondary amine. In yet another embodiment, none of $R_1$-$R_3$ is hydrogen, i.e. the basic organic amine is a tertiary amine.

In the invention and the embodiments described herein the stamp, the stamp body and/or the surface layer can be fluid-permeable. As indicated herein before, e.g. for the stamps made with impregnation methods such permeability can be advantageous.

An alternative example method of loading the stamp 14 with the basic organic group is by enclosing the basic organic group in the stamp body during its formation. In this example such formation may be through curing or cross-linking of e.g. a base material with a further material to form the polysiloxane bulk portion 110 of the stamp body. The polysiloxane-based bulk portion 110 in this method is thus formed by reacting (this preferably includes crosslinking) a polysiloxane base material with a reactive, e.g. capable of cross-linking with the base material.

This alternative enclosure method and the stamp made with it has the advantage that swelling of the stamp 14 due to solvent impregnation is avoided, such that it is more straightforward to produce a stamp 14 with a high-quality feature pattern 16, i.e. a feature pattern 16 that is not distorted by such swelling effects. It also may save stamp manufacture time.

For a polysiloxane bulk portion stamp, a suitable base material is one having free alkyne or alkene (unsaturated bond) groups such as for example vinyl groups that are capable of reacting with hydrosilane moieties of a hydrosilane modified polysiloxane. Others can be used such as aldehydes and ketones, and although these will lead to different crosslink chemistry the principle of the method is not different from the one employing the alkenes Examples of such cross-linking polysiloxanes include HMS-301 and HMS-501, which both are trimethylsiloxy-terminated methylhydrosiloxane-dimethylsiloxane copolymers marketed by the company Gelest, Incorporated. Examples of free alkene group modified polysiloxane bulk portions are the Sylgard® family of products as marketed by the Dow Corning Corporation which are polydimethylsiloxane oligomer or polymers having vinyl end-groups (an example is given in Formula 11 representing a linear vinyl end functionalised polysiloxane wherein n may be chosen according to need.

Formula 11

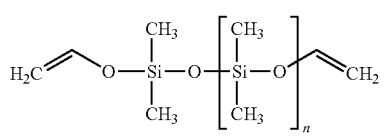

Thus, the vinyl groups of a vinyl substituted part can react with the hydrosilane moiety according to e.g. Reaction scheme II which describes the so called hydrosyllilation reaction catalysed by a hydrosililation catalyst. Hydrosililation involves addition of a hydrosilane group over the unsaturated bond of the vinyl group in this case. Hydrosililation will not be described in detail here as it is known perse. Useful catalysts are described herein below.

Reaction Scheme II

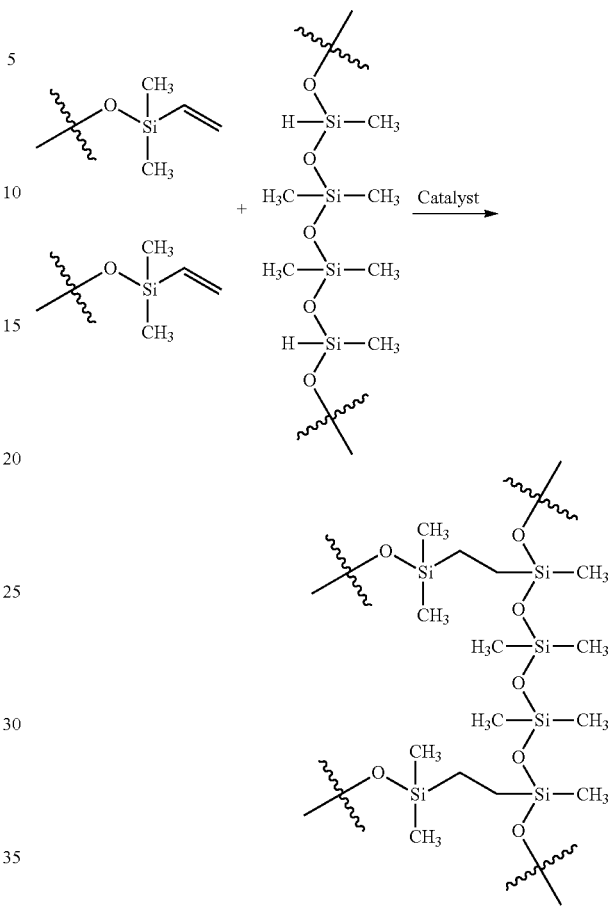

It will be clear that the reverse situation in which the base material is hydrosilane modified and the reactive polysiloxane is an alkene modified polysiloxane can also be used.

In accordance with this method, the substance (comprising the basic organic group) may be dissolved in a polysiloxane base material in an amount of at least 0.2% by weight based on the total weight of the polysiloxane base material, e.g. in an amount ranging from 0.2% to 5% by weight based on the total weight of the polysiloxane base material. The base material is one of the precursors for the bulk portion polysiloxane of the stamp body. An example of a suitable polysiloxane bulk portion base material is soft-PDMS (having a low Young's modulus of below 10) which is for example marketed by the Dow Corning Corporation under the trade name Sylgard®, or X-PDMS which is specially designed for having a higher Young's modulus of e.g. above 20) as described in WO2009/147602, which reference is herewith incorporated by reference. The base materials referred to all have vinyl groups as reactive groups to polymerise with. In the Sylgard the base material has linear polymer or oligomer polysiloxane chains while in the X-PDMS precursor base materials there are branch points where multiple of the branches (three or four branches) include vinyl groups.

The polysiloxane bulk portion base material with the substance dissolved therein subsequently may be left to stand for a period of time, e.g. at least six hours such as between 8-12 hours. The polysiloxane base material with the substance dissolved therein may be left to stand for this period of time at an elevated temperature to promote distribution of the substance through the polysiloxane base material. A suitable temperature may be chosen in the range from 30° C. to 100° C., e.g. 50° C.

Next, the cross-linking polysiloxane is added to the bulk portion base material in any suitable ratio, for example 2-5 parts by weight of the polysiloxane bulk portion base material per one part of the cross-linking polysiloxane. The cross-linking polysiloxane is a second precursor that is capable to polymerise or react with the first precursor. The mixture may be positioned in a suitable mold or master comprising a negative of the feature pattern 16 in case the feature pattern 16 is to be reproduced in the polysiloxane bulk portion 110 of the stamp 14. The mixture is subsequently cured (solidified) for a suitable period of time, e.g. for at least 4 hours, e.g. for 6-12 hours, to form the cured (cross-linked) polysiloxane bulk portion of the stamp 14, which curing may be performed at elevated temperatures to increase the reaction speed of the curing reaction. For example, the elevated temperature at which the curing reaction takes place may be chosen in the range from 30° C. to 100° C., e.g. in the range from 50° C. to 100° C. It was found that a stamp 14 produced in this manner releases without problems from a mold or master comprising the negative of the feature pattern 16.

The curing reaction is used to tune the (Young's) modulus of the polysiloxane bulk portion 110 of the stamp 14. The inclusion of linear cross-linking polysiloxane chains tunes the modulus of the polysiloxane bulk portion 110 such that the reaction conditions of the curing reaction, e.g. amount of cross-linking polysiloxane, duration and/or temperature of the curing reaction can be used to tailor the modulus of the polysiloxane bulk portion 110 to a specific modulus, i.e. to tailor the flexibility or compressibility of the polysiloxane bulk portion 110. More specifically, the low modulus siloxanes may be composed of linear chains with reactive vinyl groups at the ends, which reactive vinyl groups are cross-linked by linear hydrosiloxanes which are functionalized along the chains to adjust the modulus of the polysiloxane bulk portion 110.

At this point, it is noted that the aforementioned cross-linking reaction (see Reaction Scheme II) is of the metal complex catalyzed hydroslylation of vinyl with hydrosiloxanes type. Hydrosililation reactions like the one described hereinabove are typically catalyzed by a platinum or rhodium catalyst, as is well-known per se (see for example a review article entitled Metal complex catalyzed hydrosilylation of vinyl with hydrosiloxanes (A review) by D. A. Vekki and N. K. Skvortsov in CHEMISTRY AND CHEMICAL TECHNOLOGY•TECHNOLOGY OF ORGANIC SUBSTANCES. Suitable catalysts that were used in experiments described herein are for example Platinum-cyclovinylmethyl siloxane complex $(C_3H_6OSi)_{3-5}$ $Pt^0$; 2% Pt in cyclomethylvinylsiloxanes (CAS No 68585-32-0) or Platinum divinyltetramethyldisiloxane comples $(C_{24}H_{54}O_3Pt_2Si_6$; 2% Pt in xylene (CAS 68478-92-2) as marketed by company Gelest, Incorporated. But others can be used. In all cases care has to be taken that the catalyst is not poisoned by the substance and in particular its basic organic group as added to the polysiloxane base material. It is known that lewis acids generally are capable of poisoning the catalysts. Thus, also the basic organic groups like the amines may poison such platinum or rhodium catalysts rendering them ineffective for the crosslinking reaction. In case of the substances as indicated herein above, it appears that steric hindrance within the parts of the basic organic group is of importance for whether a substance is compatible with the catalyst or not. Generally, the tendency is that the more sterically hindered the basic group or the donor atom of the lewis base, the more compatible the base is with the platinum catalyst. Those skilled in the art will know how to select catalysts and/or basic organic groups (such as the amines) that are compatible with each other by experimentation possibly in combination with the steric hindrance criterion.

All the compounds in Table 2 were subjected to the above described enclosure method in which the substance was dissolved in an uncured PDMS in an amount between 0.5-3% by weight based on the total weight of the uncured PDMS and left to stand overnight after which a 1:1 mixture of HMS-301 and HMS-501 as obtained from Gelest, Incorporated was added in ratios of 1-5 by weight based on the total weight of the uncured PDMS, and left to stand overnight at a temperature of 50° C. Out of the compounds in Table 2, compounds 14, 17, 18-34 allowed for the platinum-catalyzed curing reaction to satisfactorily take place and hence made it into a rubber body stamp. The other compounds either prevented curing of the stamp material precursor (compounds 1, 2, 4-6, 9, 10, 12, 13, 16, 35 and 36) apparently causing catalyst poisoning, or did not mix with the precursor base material (compounds 3, 7, 8, 11, 15).

Without wishing to be bound by theory, it appears that a suitable secondary amine for use in the above described enclosure method may be an amine according to Formula 8 in which $R_1$ is hydrogen and $R_2$ and $R_3$ may be individually selected from an unsubstituted or substituted branched $C_3$-$C_{20}$ alkyl group, an unsubstituted or substituted $C_2$-$C_{20}$ alkenyl group, an unsubstituted or substituted $C_2$-$C_{20}$ alkynyl group, an unsubstituted or substituted $C_3$-$C_{20}$ cycloalkyl group, an unsubstituted or substituted $C_4$-$C_{20}$ cycloalkenyl group, an unsubstituted or substituted $C_3$-$C_{20}$ heterocyclic group, an unsubstituted or substituted $C_6$-$C_{30}$ aryl group, an unsubstituted or substituted $C_6$-$C_{30}$ alkylaryl group, an unsubstituted or substituted $C_4$-$C_{30}$ heteroaryl group.

In an embodiment of this secondary amine, $R_2$ and $R_3$ may be individually selected from an unsubstituted or substituted branched $C_3$-$C_{20}$ alkyl group and an unsubstituted or substituted $C_6$-$C_{30}$ alkylaryl group.

Preferably at least one of and more preferably at least two of $R_2$ and $R_3$ have a carbon atom attached to the nitrogen that bears at least two other atoms different from H, such as two carbon atoms. These R2 and R3 may thus be e.g. isoalkyl with a less than 20 C atoms (e.g. isopropyl, isobutyl, isopentyl isohexyl, isoheptyl, iso octyl isononyl, isodecyl, iso undecyl or iododecyl or isobutyl).

Thus, apparently a number of the secondary amines can have that introduce sufficient steric hindrance to prevent the poisoning of the hydrosililation catalyst. Tertiary amines also fulfill this characteristic.

Thus, a suitable tertiary amine for use in the above described enclosure method may be an amine according to Formula 8 in which $R_1$-$R_3$ may be individually selected from an unsubstituted or substituted linear $C_2$-$C_{20}$ alkyl group or branched $C_3$-$C_{20}$ alkyl group, an unsubstituted or substituted $C_2$-$C_{20}$ alkenyl group, an unsubstituted or substituted $C_2$-$C_{20}$ alkynyl group, an unsubstituted or substituted $C_3$-$C_{20}$ cycloalkyl group, an unsubstituted or substituted $C_4$-$C_{20}$ cycloalkenyl group, an unsubstituted or substituted $C_3$-$C_{20}$ heterocyclic group, an unsubstituted or substituted $C_6$-$C_{30}$ aryl group, an unsubstituted or substituted $C_6$-$C_{30}$ alkylaryl group, an unsubstituted or substituted $C_4$-$C_{30}$ heteroaryl group. In an embodiment of this tertiary amine, $R_1$-$R_3$ may be individually selected from an unsubstituted or substituted linear $C_2$-$C_{20}$ alkyl group or branched $C_3$-$C_{20}$ alkyl group and an unsubstituted or substituted $C_6$-$C_{30}$ alkylaryl group.

A suitable tertiary amine for use in the above described enclosure method may be an amine according to Formula 10:

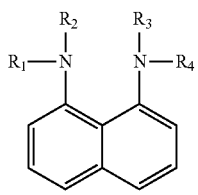

Formula 10

In Formula 10, $R_1$-$R_4$ may be individually selected from an unsubstituted or substituted linear $C_2$-$C_{20}$ alkyl group or branched $C_3$-$C_{20}$ alkyl group. For example, $R_1$-$R_4$ may be individually selected from methyl, ethyl or propyl. In an embodiment, $R_1$-$R_4$ are all the same, such as methyl or ethyl.

More general, the basic organic group preferably includes a structure according to Formula 9:

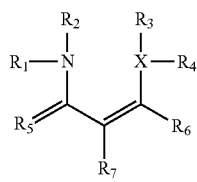

Formula 9

Herein N can be the donor atom of a lewis acid, X is chosen from the group consisting of oxygen, nitrogen, sulfur and phosphorous, and X may thus also operate as a lewis acid donor atom. $R_1$-$R_4$ are individually selected from an unsubstituted or substituted aryl group, a linear $C_2$-$C_{20}$ alkyl group or branched $C_3$-$C_{20}$ alkyl group, preferably wherein $R_1$-$R_4$ are individually selected from methyl, ethyl or propyl. $R_5$-$R_7$ can be individual organic groups or one and the same organic group comprising one or more hydrogen, carbon, oxygen, nitrogen and sulfur atoms with less than 20 carbon atoms. Preferably there are less than 10 carbon atoms. Preferably the R5 to R7 form a group with a conjugated system comprising at least the two olefinic bonds of Formula 9 and one other double bond (C=N, C=O or C=C) and or at least one other carbon-carbon triple bond. Preferably, the conjugated system is an aromatic or heteroaromatic system. Preferably the heteroaromatic system comprises at least two benzene rings.

These compounds effectively have two donor atoms reinforcing their retainment of protons or other lewis acids. Hence they provide strong bases without having formal charge. They are often referred to as superbasis.

Since monoalkylamines and some of the dialkylamines could not be incorporated directly into stamps with the above method (see e.g. compounds 9 to 13, 16) since they apparently poison the catalyst, a further method makes use of protected amines as part of the substances. One method of protecting amines is through reaction with tert-butyloxycarbonyl (Boc) group. The chemistry for protection and deprotection of the amine with such group is well known per se and will not be described in detail. One method can be heating a mixture of the amine to be protected and di-tert-butyl dicarbonate ($Boc_2O$) in tetrahydrofuran (THF) at around 40° C. Deprotection (providing the free amine group) can be done by exposing the protected amine (a carbamate) to e.g. 3M hydrochloric acid at ambient temperature. Other methods for protection with Boc and deprotection may be used. The method may be used to protect one or two hydrogen atoms born by an amine and works for primary and secondary amines. See for example: R. Varala, S. Nuvula, S. R. Adapa, J. Org. Chem., 2006, 71, 8283-8286. The protected amine can then be used during the stamp material precursor curing such as the polysiloxane materials described herein before.

Compound 30 was used to test the Boc protection method with a stamp. It was bought as is and as described herein before it was successfully built in during curing as it did not result in poisoning of the hydrosilylation catalyst. The Boc groups were removed by exposure of the stamp including compound 30 to 3M HCl in water at room temp for 60 minutes. The Boc group provides carbon dioxide and t-butanol as byproducts upon deprotection which do not interfere with the stamps function. The test was performed several times and some stamps were, after exposure to HCl rinsed with isopropanol and water to be dried in an oven at 90 C. Some of the stamps were exposed to a solution of base of a period of time after their exposure to HCl. The base can be sodium bicarbonate or brine solution or even sodium hydroxide solution. This may be done to remove HCL bound to free amine groups.

Thus with this method effectively all amines can be incorporated using the in situ curing method.

For PDMS stamps formed by the above enclosure method, it was found that upon bringing this stamp into contact with a 1:1 (by weight) of a TMOS-MTMS sol-gel layer of 70-250 nm thickness on a silicon substrate with and without EEOL having a pH of about 4.5, all stamps effectively solidified the TMOS-MTMS sol-gel layer in less than 60 seconds. For some of the compounds (all tertiary amines) such as e.g. 14, 22-24 this could be repeated at least 50 times without observable degradation in the fidelity of the feature pattern formed in the solidified TMOS-MTMS sol-gel layer and without a significant increase in the curing time of the TMOS-MTMS sol-gel layer, thus demonstrating that the basic organic amine is substantially retained within the PDMS stamp without degrading its feature pattern 16.

As a comparative example, a PDMS stamp without an enclosed substance was used to imprint of a TMOS-MTMS sol-gel layer of 70-250 nm thickness on a silicon substrate with and without EEOL having a pH of about 4.5. In this comparative example, complete cross-linking of the sol-gel system took about 20 minutes. This potentially can be explained by the fact that under acidic conditions, predominantly linear chains are formed in the polycondensation reaction whereas under basic conditions predominantly cross-linked chains are formed in the polycondensation reaction, such that catalysis of the polycondensation reaction by a base reduces the time required to form the cross-linked polysiloxane network. More generally, base-catalysed alkoxysilane polycondensation reactions are faster than acid-catalysed alkoxysilane polycondensation reactions.

The excellent retention of the basic compounds within the stamp 14 is furthermore demonstrated by the fact that in the above experiments, residues of the sol-gel system remaining on the stamp after the imprinting process could be removed by immersing the stamp into a 1% HF solution for two minutes, rinsing with deionized water, after which the stamp was baked for 15 minutes on a hot plate at 70° C. Following this cleaning procedure, the catalytic activity of the stamp in subsequent imprinting cycles was unaffected.

In an embodiment, the stamp 14 may comprise a separate surface layer 120 as previously explained. In this embodiment, the surface layer 120 may be grafted or adhered to the polysiloxane bulk material into which the basic organic amine is dissolved prior to curing of the polysiloxane bulk material, after a partial curing of the polysiloxane bulk material or post-curing of the polysiloxane bulk material. This has the advantage that the surface layer 120 including the feature pattern 16 is not exposed to the basic organic amine during its manufacture, e.g. its curing. This therefore safeguards the desired elastomeric properties of this surface layer because interference of the basic organic amine in particular in the curing reaction of the surface layer is avoided. Instead, the basic organic amine may diffuse into the surface layer 120 following its grafting or adhesion to the polysiloxane bulk 110. For this reason, it is preferred that the surface layer 120 is grafted or adhered to the polysiloxane bulk 110 prior to (completion of) the curing reaction of the polysiloxane bulk 110, such that the elevated temperatures at which the curing reaction may be performed, e.g. temperatures in the range of 30-100° C., can accelerate the diffusion process, thereby ensuring that sufficient basic organic amine is diffused into the surface layer 120 to effectively catalyse the polymerization reactions in the imprinting composition layer 12 when the elastomer stamp 14 is brought into contact with this imprinting composition layer.

In an experiment, compound 22 was enclosed in a soft-PDMS stamp layer (Young's modulus of about 2-3 MPa) in amounts of 2%, 1%, 0.5%, 0.25 and 0.125% after which a X-PDMS layer (Young's modulus of about 70-80 MPa) was adhered to the soft-PDMS stamp layer. The layer stack was subsequently cured at 50° C. for 2-24 h hours. Immediately after curing, the thus obtained stamp having a total thickness of 500-1000 micron was brought into contact with a TMOS-MTMS sol-gel layer of 60-150 nm thickness on a silicon substrate with desired cross-linking of the sol-gel layer achieved within 30 seconds.

In the above embodiments, the basic organic amine preferably has a vapour pressure not exceeding 0.2 mbar at 25° C. to avoid excessive evaporation of the basic organic substance from the stamp 14. Such evaporation in the vicinity of the imprinting composition 12, e.g. during positioning of the stamp 14 over the substrate 10, can cause the undesired transfer of the basic organic amine from the stamp 14 into the imprinting composition 12, which undesired transfer can cause premature polymerization of the imprinting composition 12. Such premature solidification of the imprinting composition 12 can prohibit (high fidelity) reproduction of the feature pattern 16 in the imprinting composition 12 as previously explained. To avoid substantial evaporation in general larger mol weight substances are preferred. Thus, the substituents of the successfully included compounds, such as e.g. mono-, di- and trialkyl amines in stamps may have more than 5 carbon atoms. Preferably more than 10 more preferably more than 15 or even more than 20. For example the above mentioned secondary or tertiary amines with such number of compounds can be used. The person skilled in the art can pick e.g. the relevant ones form table 2 according to these concepts.

Other reactive crosslinking materials and reaction schemes than the ones described herein above can be used to arrive at a stamp of the invention having bases incorporated either through impregnation or build-in via reaction.

Yet another method of manufacture of stamps according to the invention builds on the method where curing of the stamp body material is done in presence of a substance carrying the organic basic group as described herein above for example for stamp bodys of polysiloxanes and organic amine compounds. This may be referred to as the incorporation method. In this method, the substances are chosen such as to comprise a reactive group that may react with the elastomer body precursor material for example during the curing of the elastomer body precursor material to form the organic polymeric bulk portion and/or the surface layer. Using this approach, the substance and therewith the basic organic groups can be permanently linked (through covalent bonding) to the elastomer stamp body.

The method will be exemplified for the polysiloxane stamp as described herein above. Thus a PDMS base material (precursor) having vinyl end-groups was mixed with any one of the compounds 30 to 36 of Table 2. Concentrations or amounts used were the same as used in the curing method described herein before. Most of these compounds also have vinyl end-groups except for compounds 35 and 36 which have trialkoxysilane groups as reactive groups. While compounds 30 to 32 were added to the total curable mixtures in amounts of 1 weight %, these amounts are 3% for compounds 33 to 36. To the mixture was added a crosslinking polysiloxane having hydrosilane groups and a hydrosililation catalyst as was done for the earlier described curing experiments The amounts of the base material (first precursor) and crosslinker polysiloxane (second precursor) are as used in the inclusion method described herein before.

All, of the precursor (curable) mixtures except for the one having compounds 35 and 36, resulted in an elastomer solidified polysiloxane bulk portion having the compound added attached to the crosslinked polysiloxane backbone of the elastomer stamp body. The stiffness of stamps with compounds 33 and 34 was somewhat high and that resulted in less useful stamps. The vinyl end-groups participated well in the hydrosililation reaction, but the trialkoxy silane compounds 35 and 36 did not crosslink via the alkoxysilanes.

Again as described herein before, the compound 30 is a protected amine and this one was after curing of the stamp material subjected to deprotection as described hereinabove.

The PDMS in the latter method can be a soft PDMS (such as Sylgard based as described hereinabove and based on linear base material) or a somewhat stiffer PDMS such as the X-PDMS based on branched base material. Either one of them can be mixed with a linear hydrosilane containing second precursor.

If the stamp is designated to have the organic surface layer, then this is the layer that preferably includes the bound base compounds. Hence, to achieve this, the method as used for the inclusions method described herein before can be used for the incorporation method.

It will be clear that also for this method, the nature of the basic organic group must be chosen such as not to interfere with the curing reaction. Thus the sterically hindered amines will work best if hydrosililation is used for the curing and crosslinking reaction. Also protect amines or protected other lewis acid bases can be used with the invention.

The stamps obtained with the attached bases were tested in imprint processes using test situation similar to the ones used herein above. While all of them showed an increased solidification speed upon imprinting compared to an analogous stamp not having the compounds incorporated, compound 31 to 34 provided faster solidification than stamps with compound 35 and 36. While compound 32 provided good speed, compound 31 gave best curing and stamp characteristics. Although.

The invention of having an elastomer stamp including a base that is suitable for stimulating the solidification of an imprinting solution has been elucidated in detail with regard to elastomer stamp bodys including polysiloxane bulk portion. Without departing from the inventive concept it will be clear that other elastomers and rubbers may also be used. Many such materials are available in the prior art and commercially. Indeed, for the impregnation method, such rubbers must be permeable. Otherwise inclusion methods with curing (polymerisation) of bulk portion precursors with in situ presence of bases or protected bases needs to be performed. Although these are not explicitly described herein, the invention as implemented can still work.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method comprising:
   providing an elastomer stamp body including: an organic polymeric bulk portion and a patterned surface;
   impregnating the elastomeric stamp body with an amount of a basic organic substance dissolved in a solvent to provide an impregnated elastomer stamp body, the substance comprising an amount of a basic organic group, the amount of the basic organic group being suitable to influence solidification of an imprinting composition upon contacting of a the-manufactured stamp with the imprinting composition;
   removing at least part of the solvent from the impregnated elastomer stamp body to leave the elastomer stamp body comprising the basic organic substance; and
   contacting the elastomeric stamp body with an imprinting composition wherein the substance comprising a basic organic group promotes solidification of the imprinting composition by crosslinking.

2. The method according to claim 1, wherein the organic polymeric bulk portion comprises a polysiloxane and the impregnating is performed by dissolving an amount of the basic organic substance in an organic solvent.

3. A method of manufacturing a stamp, the method comprising:
   providing a mixture of:
      one or more precursors each comprising at least one first reactive group with which it can polymerise to form an organic polymeric bulk portion, and
      a substance comprising a basic organic group, or comprising a protected basic organic group which does not substantially prohibit the polymerisation of the one or more precursors;
   polymerising the organic polymeric bulk portion precursor to form the organic polymeric bulk portion having enclosed therein the substance; and
   when the substance comprises the protected basic organic group, deprotecting the basic organic group to provide the basic organic group.

4. The method according to claim 3, wherein:
   the one or more precursors comprises:
      a first polysiloxane precursor having as the at least one first reactive group at least two groups each including an unsaturated bond and each chosen from the group consisting of alkyne, alkene, vinyl, aldehyde, ketone and imine, and
      a second polysiloxane precursor having at least two hydrosilane groups, and wherein the mixture further comprises
      a hydrosilylation catalyst for catalysing an addition of an hydrosilane group across the unsaturated bond and wherein the polymerisation includes causing the addition of the hydrosilane groups across the unsaturated bonds to therewith form the organic polymeric bulk portion.

5. The method according to claim 3, wherein the substance further comprises at least one second reactive group for reacting with the first reactive group, and wherein the polymerisation includes causing a reaction between the first reactive group and the second reactive group to therewith attach the substance to the organic polymeric bulk portion.

6. The method as claimed in claim 5, wherein
   the one or more precursors comprise:
      a first polysiloxane precursor having as the at least one first reactive group at least two groups each including an unsaturated bond and each chosen from the group consisting of alkyne, alkene, vinyl, aldehyde, ketone and imine, and
      a second polysiloxane precursor having at least two hydrosilane groups, and
   the at least one second reactive group is chosen from the group consisting of alkyne, alkene, vinyl, aldehyde, ketone, imine and hydrosilane; and
   the mixture further comprises:
   a hydrosilylation catalyst for catalysing an addition of an hydrosilane group across the unsaturated bond; and wherein the polymerisation includes causing the addition of the hydrosilane groups across the unsaturated bonds to therewith form the organic polymeric bulk portion.

7. A method of forming a patterned layer, the method comprising:
   providing a layer of an imprinting composition, the imprinting composition being capable of solidification under the influence of a basic organic group;
   contacting the imprinting composition layer with a stamp comprising a patterned surface such that the layer is solidified by crosslinking and a relief feature pattern is imprinted into the layer of the cured imprinting composition;
   wherein the stamp comprises an elastomer stamp body including an organic polymeric bulk portion containing an amount of a basic organic substance, the substance comprising an amount of the basic organic group suitable to influence solidification of the imprinting composition upon contacting of the stamp with the imprinting composition;
   retaining the contact between the layer of the imprinting composition and the stamp until the imprinted composition has reached a desired degree of solidification; and releasing the stamp from the solidified layer of the imprinting composition to yield the patterned layer.

8. The method as claimed in claim 7, wherein the imprinting composition comprises a sol-gel based imprinting composition.

9. The method of claim 1, wherein the removing is performed, such that, after the removing of the at least part of the organic solvent, the basic organic substance in the elastomer stamp body is at least 0.1% by weight based on a total weight of the elastomer stamp body.

10. The method of claim 1, wherein the removing includes rinsing the impregnated elastomer stamp body, to reduce the at least part of the solvent from the impregnated elastomer stamp body.

11. The method of claim 1, wherein the removing includes drying the impregnated elastomer stamp body to evaporate the al least part of the solvent in the impregnated elastomer stamp body.

12. The method of claim 1, wherein the removing includes:
   rinsing the impregnated elastomer stamp body, to reduce the at least part of the solvent from the impregnated elastomer stamp body; and
   after the rinsing, drying the impregnated elastomer stamp body to evaporate the al least part of the solvent in the impregnated elastomer stamp body.

\* \* \* \* \*